(12) United States Patent
Park et al.

(10) Patent No.: US 12,490,638 B2
(45) Date of Patent: Dec. 2, 2025

(54) DISPLAY DEVICE

(71) Applicant: Samsung Display Co., Ltd., Yongin-Si (KR)

(72) Inventors: Heungshik Park, Yongin-si (KR); Kangwook Heo, Yongin-si (KR); Jungmin Park, Yongin-si (KR); Wonhak Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 18/135,215

(22) Filed: Apr. 17, 2023

(65) Prior Publication Data

US 2024/0032403 A1    Jan. 25, 2024

(30) Foreign Application Priority Data

Jul. 20, 2022   (KR) .................. 10-2022-0089880
Nov. 24, 2022   (KR) .................. 10-2022-0159495

(51) Int. Cl.
*H10K 59/80*     (2023.01)
*H10K 59/40*     (2023.01)
*H10K 102/00*    (2023.01)

(52) U.S. Cl.
CPC .......... *H10K 59/879* (2023.02); *H10K 59/40* (2023.02); *H10K 59/8792* (2023.02); *H10K 59/8793* (2023.02); *H10K 2102/311* (2023.02); *H10K 2102/351* (2023.02)

(58) Field of Classification Search
CPC .. H10K 59/8792; H10K 59/40; H10K 77/111; H10K 59/8793; H10K 59/873; H10K 59/879; H10K 2102/311; H10K 59/8791; H10K 2102/351; Y02E 10/549
See application file for complete search history.

(56) References Cited

U.S. PATENT DOCUMENTS

| 9,276,055 | B1 | 3/2016 | Son et al. |
| 11,503,723 | B2 * | 11/2022 | Yang .................. G06F 1/1681 |
| 11,899,167 | B2 * | 2/2024 | Nishio .................. C08J 7/046 |
| 11,930,671 | B2 | 3/2024 | Tong et al. |
| 2018/0308903 | A1 | 10/2018 | Jeong et al. |

(Continued)

FOREIGN PATENT DOCUMENTS

| EP | 3929994 A2 | 12/2021 |
| KR | 10-2021-0122955 A | 10/2021 |

(Continued)

*Primary Examiner* — Vinh T Lam
(74) *Attorney, Agent, or Firm* — Innovation Counsel LLP

(57) ABSTRACT

Provided is a display device including: a substrate including a display area and a peripheral area that includes a bending area disposed adjacent to the display area; a plurality of pixels arranged in the display area; a driving circuit arranged in the peripheral area; a barrier rib layer arranged in the bending area; an input detection layer disposed on the plurality of pixels; and an optical functional layer including a first layer that is disposed on the input detection layer and includes a first opening in an area corresponding to the plurality of pixels, and a second layer that is disposed on the first layer and having a refractive index different from the first layer, wherein the first layer includes at least one valley located between the bending area and the driving circuit.

23 Claims, 22 Drawing Sheets

(56) References Cited

U.S. PATENT DOCUMENTS

| | | | |
|---|---|---|---|
| 2021/0313387 A1 | 10/2021 | Bang et al. | |
| 2021/0365146 A1 | 11/2021 | Kim et al. | |
| 2021/0397216 A1 | 12/2021 | Kim et al. | |
| 2022/0123076 A1 | 4/2022 | Kim | |
| 2022/0285463 A1* | 9/2022 | Lee | H10K 59/88 |

FOREIGN PATENT DOCUMENTS

| | | |
|---|---|---|
| KR | 10-2021-0157527 A | 12/2021 |
| KR | 10-2022-0052390 A | 4/2022 |
| WO | 2021120164 A1 | 6/2021 |

\* cited by examiner

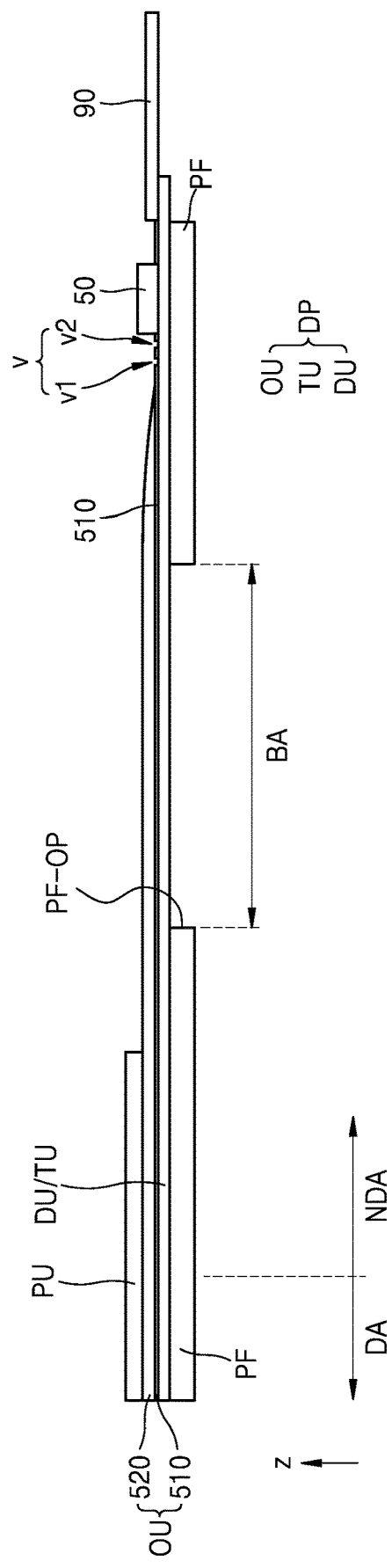

DISPLAY DEVICE

CROSS-REFERENCE TO RELATED APPLICATION

This application is based on and claims priority under 35 U.S.C. § 119 to Korean Patent Application No. 10-2022-0089880, filed on Jul. 20, 2022, and Korean Patent Application No. 10-2022-0159495, filed on Nov. 24, 2022, in the Korean Intellectual Property Office, the disclosure of which is incorporated by reference herein in its entirety.

BACKGROUND

1. Field

One or more embodiments relate to a display device, and more particularly, to a display device, in which the width of a non-display area is reduced and the thickness is reduced in overall.

2. Description of the Related Art

Among display devices, an organic light-emitting display device is receiving attention as a next-generation device due to not only a wide viewing angle and excellent contrast, but also a quick response speed.

Generally, the organic light-emitting display device includes a thin-film transistor and an organic light-emitting diode formed on a substrate. The organic light-emitting diode is a self-emissive device. Such an organic light-emitting display device may be used as a display of a small product such as a mobile phone, or as a display of a large product such as a television.

SUMMARY

One or more embodiments include a display device, in which the width of a non-display area is reduced and the thickness is reduced in overall. However, such objectives are only examples and the scope of the disclosure is not limited thereby.

Additional aspects will be set forth in part in the description which follows and, in part, will be apparent from the description, or may be learned by practice of the presented embodiments of the disclosure.

According to one or more embodiments, a display device includes a substrate including a display area and a peripheral area that includes a bending area disposed adjacent to the display area, a display element arranged in the display area, a driving circuit arranged in the peripheral area, a barrier rib layer arranged in the bending area, an input detection layer disposed on the display element, and an optical functional layer including a first layer that is disposed on the input detection layer and includes a first opening in an area corresponding to the display element, and a second layer that is disposed on the first layer and having a refractive index different from the first layer, wherein the first layer includes at least one valley located between the bending area and the driving circuit.

The first layer may extend from the display area to the peripheral area and include a second opening in an area corresponding to the bending area, and the second layer may directly contact a top surface of the barrier rib layer through the second opening.

The at least one valley may include a first valley and a second valley which are spaced apart from each other.

The bending area may bend about a bending axis extending in a first direction and the at least one valley may extend in the first direction.

The second layer may extend to the peripheral area and an end of the second layer may be located between the at least one valley and the bending area.

The second layer may extend to the peripheral area and an end of the second layer may be located in the at least one valley.

The second layer may have a modulus of 0.2 GPa to 1.5 GPa.

The second layer may have elongation of 10% or greater.

The second layer may have light transmittance of 90% or greater.

An air layer may be disposed on the second layer corresponding to the bending area.

A light-shielding portion may be further arranged on an upper portion of the second layer in an area corresponding to the peripheral area, and a space of the bending area between the second layer and the light-shielding portion may be an empty space.

An interval between the at least one valley and the driving circuit may be 100 μm to 400 μm.

A top surface of the second layer may be flat on the display area and bending area.

A thickness of the second layer may gradually decrease to an end of the second layer.

The display device may further include a protection film disposed on one surface of the substrate, wherein the protection film may include an opening area in an area corresponding to the bending area.

The second layer may include a first portion having a first thickness in an area corresponding to the display area, a second portion having a second thickness in an area corresponding to a first boundary portion of the protection film adjacent to the display area, and a third portion having a third thickness in an area corresponding to a second boundary portion of the protection film which is opposite to the first boundary portion, wherein the second thickness of the second portion may be greater than the first thickness of the first portion.

The second thickness of the second portion may be greater than the third thickness of the third portion.

The third thickness of the third portion may be greater than the first thickness of the first portion and less than the second thickness of the second portion.

The first thickness of the first portion may be 10 μm to 25 μm, and the second thickness of the second portion may be 20 μm to 40 μm.

The display device may further include a polarizing layer disposed on the second layer in an area corresponding to the display area, and a window layer disposed on the polarizing layer.

The display device may further include an inorganic insulating layer disposed on the substrate and including an opening portion in an area corresponding to the bending area, wherein the barrier rib layer may be arranged to cover the opening portion.

The second layer may include about 5% to about 40% of difunction acrylate monomers.

A bending protection layer may be further disposed on the second layer corresponding to the bending area.

Other aspects, features, and advantages may become clear from the following drawings, the claims, and the detailed description of the disclosure.

These general and specific aspects may be practiced using a system, method, computer program, or any combination of systems, methods, and computer programs.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 8 is a cross-sectional view of a portion of a display device including a cross-section of the display panel taken along a line C-C' of FIG. 6;

DETAILED DESCRIPTION

Figure 1:
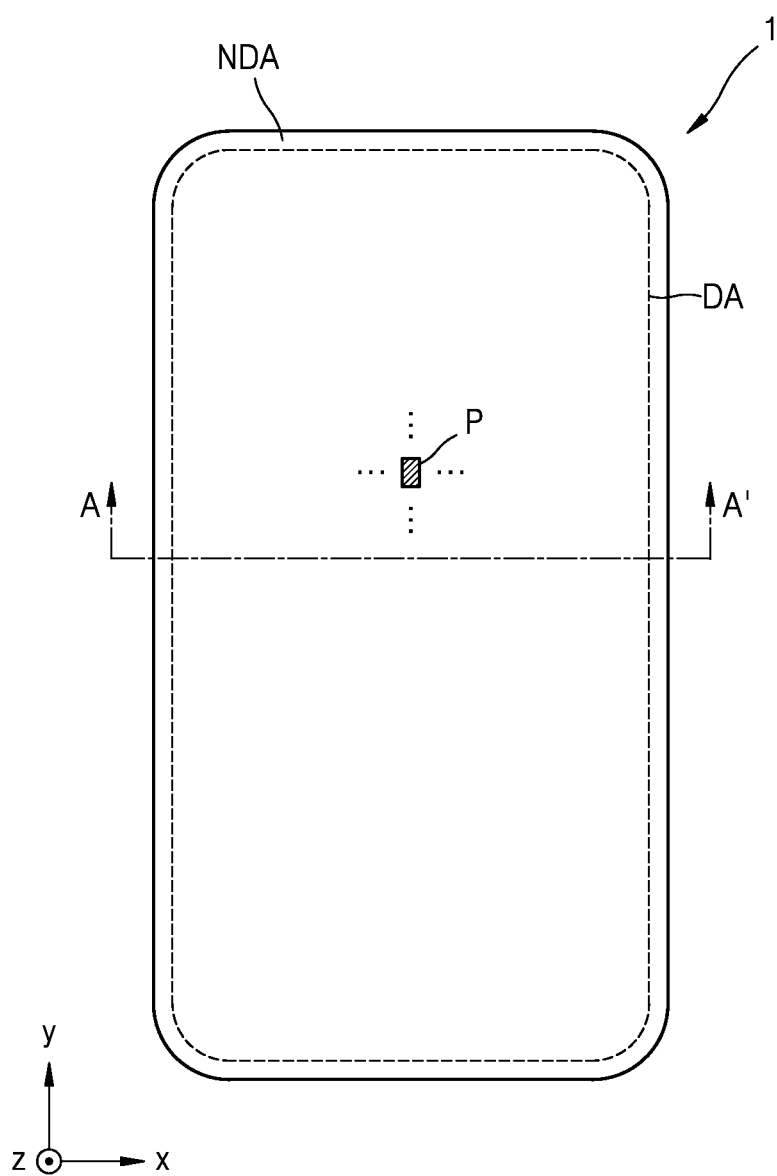
FIG. 1 is a plan view schematically showing a portion of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may have various modifications and various embodiments, and specific embodiments are illustrated in the drawings and are described in detail in the detailed description. Effects and features of the disclosure and methods of achieving the same will become apparent with reference to embodiments described in detail with reference to the drawings. However, the disclosure is not limited to the embodiments described below, and may be implemented in various forms.

Hereinafter, embodiments will be described in detail with reference to the accompanying drawings, and in the following description with reference to the drawings, like reference numerals refer to like elements and redundant descriptions thereof will be omitted.

In the specification, the terms "first" and "second" are not used in a limited sense and are used to distinguish one component from another component.

In the specification, an expression used in the singular encompasses the expression of the plural, unless it has a clearly different meaning in the context.

In the specification, it will be further understood that the terms "comprise" and/or "comprising" used herein specify the presence of stated features or components, but do not preclude the presence or addition of one or more other features or components.

It will be understood that when a layer, region, or element is referred to as being "formed on" another layer, area, or element, it can be directly or indirectly formed on the other layer, region, or element. That is, for example, intervening layers, regions, or elements may be present.

When a layer, region, component, or the like is connected to another layer, region, component, or the like, the layer, the region, the component, or the like may be directly connected thereto and/or may be indirectly connected thereto with an intervening layer, region, component, or the like therebetween. For example, in the specification, when a layer, region, component, or the like is electrically connected to another layer, region, component, or the like, the layer, region, component, or the like may be directly electrically connected thereto and/or may be indirectly electrically connected thereto with an intervening layer, region, component, or the like therebetween.

In the specification, "A and/or B" denotes only A, only B, or both A and B. Also, "at least one of A and B" denotes only A, only B, or both A and B.

In the specification, an x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a plan view schematically showing a portion of a display device 1 according to an embodiment.

Referring to FIG. 1, the display device 1 includes a display area DA and a peripheral area NDA outside the display area DA. A plurality of pixels P including display elements are arranged in the display area DA, and the display device 1 may provide an image by using light emitted from the plurality of pixels P arranged in the display area DA. The peripheral area NDA is a type of non-display area where display elements are not arranged, and the display area DA may be entirely surrounded by the peripheral area NDA.

In FIG. 1, the display device 1 includes a flat display surface, but the disclosure is not limited thereto. According to another embodiment, the display device 1 may include a 3-dimensional display surface or a curved display surface.

When the display device 1 includes the 3-dimensional display surface, the display device 1 may include a plurality of display areas that extend in different directions, for example, may include polygonal columnar display surface. According to another embodiment, when the display device 1 includes the curved display surface, the display device 1 may be embodied in any one of various types, such as flexible, foldable, and rollable display devices.

According to an embodiment, FIG. 1 illustrates the display device 1 that may be used for a mobile phone terminal. Although not illustrated, the mobile phone terminal may be configured as electronic modules, a camera module, and a power supply module which are mounted on a main board and are arranged in a bracket/case together with the display device 1. The display device 1 according to the disclosure may be used for small and medium electronic devices such as a tablet computer, vehicle navigation device, a game device, and a smart watch, as well as large electronic devices such as a television and a monitor.

In FIG. 1, the display area DA of the display device 1 is rectangular with round corners, but according to another embodiment, the shape of the display area DA may be circular or oval, or polygonal such as triangular or pentagonal.

Hereinafter, an organic light-emitting display device including an organic light-emitting diode as a display element is described as an example of the display device 1 according to an embodiment, but a display device of the disclosure is not limited thereto. According to another embodiment, the display device 1 of the disclosure may be an inorganic light-emitting display or an inorganic EL display, or may be a quantum dot light-emitting display. For example, an emission layer of the display element included in the display device 1 may include an organic material, include an inorganic material, include a quantum dot, include an organic material and a quantum dot, or include an inorganic material and a quantum dot.

Figure 2A:
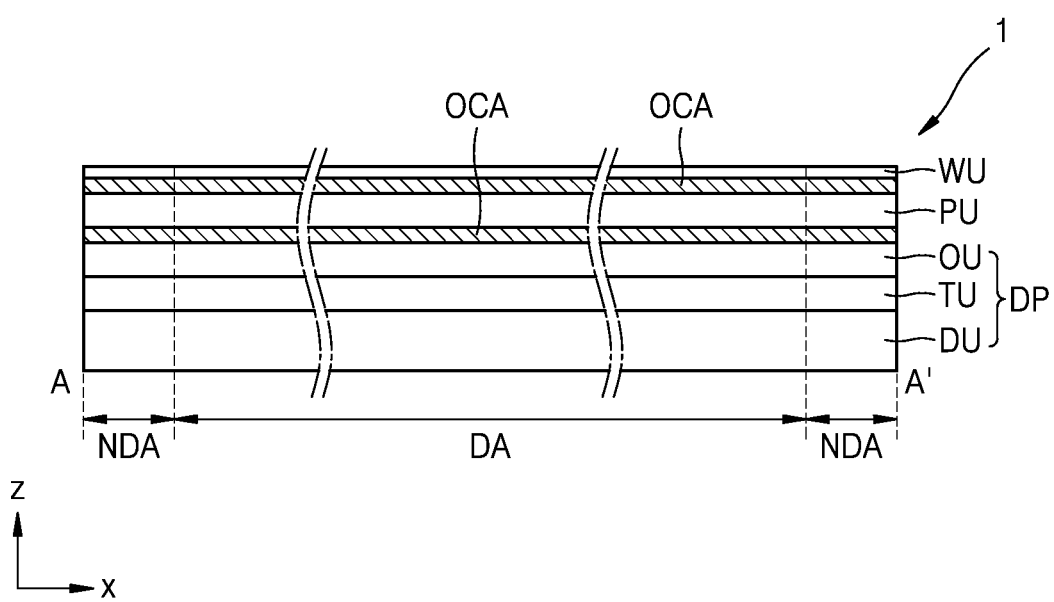
FIGS. 2A and 2B are cross-sectional views of the display device taken along a line A-A' of FIG. 1.
Figure 2B:
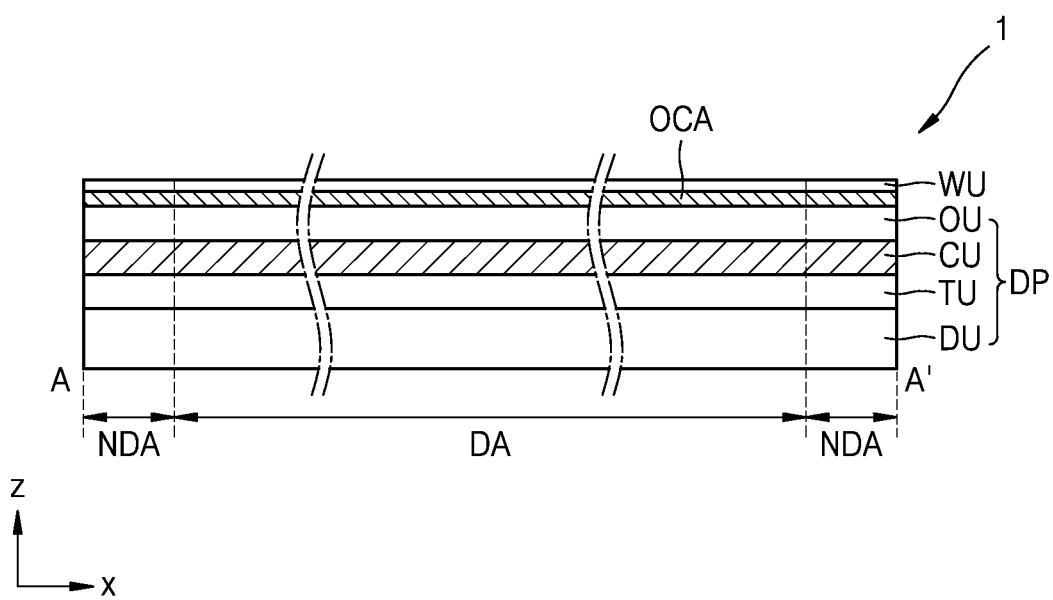
Figure 3:
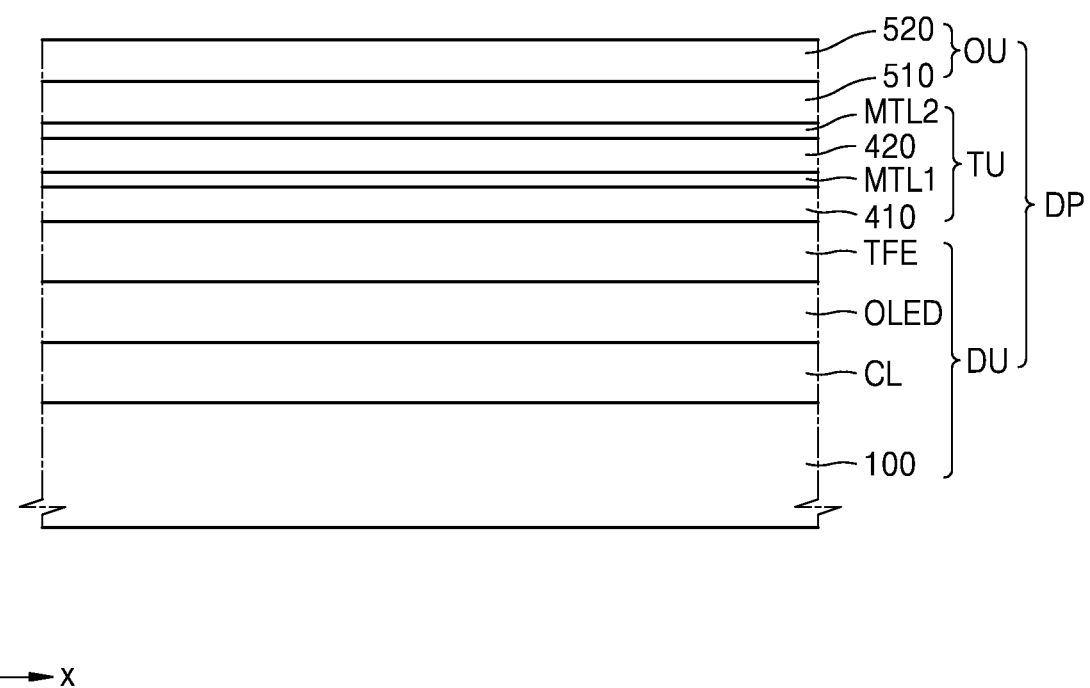
FIG. 3 is a cross-sectional views showing a portion of a display device according to an embodiment.

FIGS. 2A and 2B are cross-sectional views of the display device 1 taken along a line A-A' of FIG. 1, and FIG. 3 is a plan view schematically showing a portion of the display device 1 according to an embodiment.

FIGS. 2A, 2B, and 3 are simply illustrated to describe stack structures of functional panels and/or functional layers constituting the display device 1.

Referring to FIG. 2A, the display device 1 according to an embodiment may include a display layer DU, an input detection layer TU, an optical functional layer OU, a polarizing layer PU, and a window layer WU. At least some of the display layer DU, input detection layer TU, optical functional layer OU, polarizing layer PU, and window layer WU may be formed through consecutive processes, and at least some thereof may be combined with each other through an adhesive layer. An optically clear adhesive OCA is illustrated as an example of the adhesive layer in FIG. 2A. The adhesive layer described below may include a general adhesive or a gluing agent. According to an embodiment, the polarizing layer PU and window layer WU may be replaced by other components or may be omitted.

According to an embodiment, the input detection layer TU is disposed directly on the display layer DU. In the present specification, when "a B component is directly disposed on an A component", there is no separate adhesive layer between the A component and the B component. The B component is formed through a consecutive process on a base surface provided by the A component after the A component is formed.

The display layer DU, and the input detection layer TU and optical functional layer OU directly disposed on the display layer DU may be defined as a display panel DP. According to an embodiment, as shown in FIG. 2A, the optically clear adhesive OCA may be arranged between the display panel DP and the polarizing layer PU, and between the polarizing layer PU and the window layer WU.

According to another embodiment, the display panel DP may include an anti-reflection layer CU as shown in FIG. 2B. The anti-reflection layer CU may be arranged between the input detection layer TU and the optical functional layer OU. The anti-reflection layer CU may include a color filter provided to correspond to an emission region of each pixel P, and a light-shielding layer provided to correspond to a non-emission region between the pixels P. According to an embodiment, the optically clear adhesive OCA may not be arranged between the anti-reflection layer CU and the input detection layer TU, but may be directly disposed on the input detection layer TU.

The display layer DU generates an image and the input detection layer TU obtains coordinate information of an external input (for example, a touch event). Although not separately illustrated, the display panel DP according to an embodiment may further include a protection layer (for example, a protection film) disposed on a bottom surface of the display layer DU. The protection layer and the display layer DU may be combined with each other through an adhesive layer.

The optical functional layer OU may enhance light efficiency. The optical functional layer OU may enhance, for example, front light efficiency and/or side visibility of light emitted from an organic light-emitting diode OLED.

The polarizing layer PU reduces reflectance of external light incident from the top of the window layer WU. The polarizing layer PU according to an embodiment may include a retarder and a polarizer. The retarder may be a film type or a liquid crystal coating type, and may include a $\lambda/2$ retarder and/or a $\lambda/4$ retarder. The polarizer may also be a film type or a liquid crystal coating type. The film type may include an elongated synthetic resin film, and the liquid crystal coating type may include liquid crystals arranged in a certain arrangement. The retarder and the polarizer may further include a protection film. The retarder and polarizer, or the protection films thereof may be defined as a base layer of the polarizing layer PU.

Hereinafter, structures of the display layer DU, input detection layer TU, and optical functional layer OU will be described in detail with reference to FIG. 3.

Referring to FIG. 3, the display panel DP includes the display layer DU and the input detection layer TU. The display layer DU is simply illustrated to describe a stack structure of the input detection layer TU. Also, the polarizing layer PU of FIG. 2A and the window layer WU of FIG. 2A, which may be disposed on the input detection layer TU, are omitted.

In the display layer DU, a circuit layer CL, the organic light-emitting diode OLED, and a thin-film encapsulation layer TFE may be sequentially arranged on a substrate 100. The input detection layer TU may be directly disposed on the thin-film encapsulation layer TFE. The thin-film encapsulation layer TFE includes at least one organic encapsulation layer 320 as in FIG. 10 described below, and thus may provide further flattened base surface. Accordingly, components of the input detection layer TU described below may have reduced percent defective even when the components are formed through consecutive processes.

The input detection layer TU may have a multi-layer structure. The input detection layer TU includes a detection electrode, a trace line connected to the detection electrode, and at least one insulating layer. For example, the input detection layer TU may detect an external input in a capacitance manner. In the disclosure, an operation method of the input detection layer TU is not specifically limited, and according to an embodiment, the input detection layer TU may detect an external input in an electromagnetic induction manner or in a pressure detection manner.

As shown in FIG. 3, the input detection layer TU according to an embodiment may include a first inorganic insulating layer 410, a first conductive layer MTL1, a second inorganic insulating layer 420, and a second conductive layer MTL2.

For example, each of the first conductive layer MTL1 and the second conductive layer MTL2 may have a single-layer structure or a stack multi-layer structure. A conductive layer of a single-layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), or indium tin zinc oxide (ITZO). In addition, the transparent conductive layer may include a conductive polymer such as PEDOT, a metal nano-wire, or graphene.

A conductive layer of a multi-layer structure may include metal layers. The metal layers may have, for example, a 3-layer structure of Ti/Al/Ti. The conductive layer of a multi-layer structure may include at least one metal layer and at least one transparent conductive layer.

Each of the first conductive layer MTL1 and the second conductive layer MTL2 includes a plurality of patterns. Hereinafter, it will be understood that the first conductive layer MTL1 includes first conductive patterns and the second conductive layer MTL2 includes second conductive patterns. The first conductive patterns and the second conductive patterns may form the detection electrode. According to an embodiment, the detection electrode may have, for example, a mesh shape to be invisible to a user.

Each of the first inorganic insulating layer 410 and the second inorganic insulating layer 420 may have a single-layer or multi-layer structure. Each of the first inorganic insulating layer 410 and the second inorganic insulating layer 420 may include an inorganic material or a complex material. For example, at least one of the first inorganic insulating layer 410 and the second inorganic insulating layer 420 may include an inorganic layer. The inorganic layer may include at least one of aluminum oxide, titanium oxide, silicon oxide, silicon oxynitride, zirconium oxide, and hafnium oxide. According to another embodiment, the first inorganic insulating layer 410 and/or the second inorganic insulating layer 420 may be replaced by an organic insulating layer.

The optical functional layer OU may be directly disposed on the input detection layer TU. The optical functional layer OU may include a first layer 510 and a second layer 520 disposed on the first layer 510. The first layer 510 and the second layer 520 may include an organic insulating material and have different refractive indexes. According to an embodiment, the refractive index of the second layer 520 may be greater than the refractive index of the first layer 510.

Figure 4:
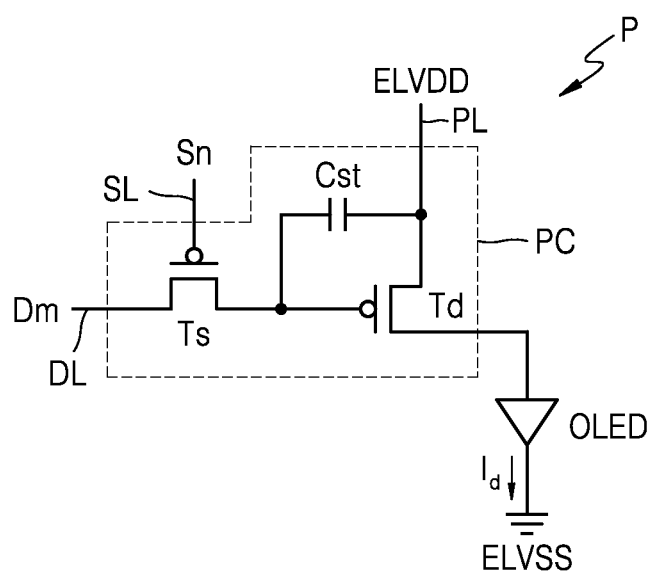
FIG. 4 is an equivalent circuit diagram of a pixel that may be included in a display device according to an embodiment.

FIG. 4 is an equivalent circuit diagram of the pixel P that may be included in the display device 1, according to an embodiment.

Referring to FIG. 4, each pixel P includes a pixel circuit PC connected to a scan line SL and a data line DL, and the organic light-emitting diode OLED connected to the pixel circuit PC.

The pixel circuit PC may include a driving thin-film transistor Td, a switching thin-film transistor Ts, and a storage capacitor Cst. The switching thin-film transistor Ts is connected to the scan line SL and the data line DL, and may be configured to transmit, to the driving thin-film transistor Td, a data signal Dm input through the data line DL according to a scan signal Sn input through the scan line SL.

The storage capacitor Cst is connected to the switching thin-film transistor Ts and a driving voltage line PL, and is configured to store a voltage corresponding to a difference between a voltage received from the switching thin-film transistor Ts and a driving voltage ELVDD supplied to the driving voltage line PL.

The driving thin-film transistor Td is connected to the driving voltage line PL and the storage capacitor Cst, and may be configured to control a driving current flowing through the organic light-emitting diode OLED from the driving voltage line PL in response to a voltage value stored in the storage capacitor Cst. The organic light-emitting diode OLED may emit light of a certain luminance according to a driving current $I_d$.

In FIG. 4, the pixel circuit PC includes two thin-film transistors and one storage capacitor, but the disclosure is not limited thereto. According to another embodiment, the pixel circuit PC may include seven thin-film transistors and one storage capacitor. According to another embodiment, the pixel circuit PC may include two or more storage capacitors.

Figure 5:
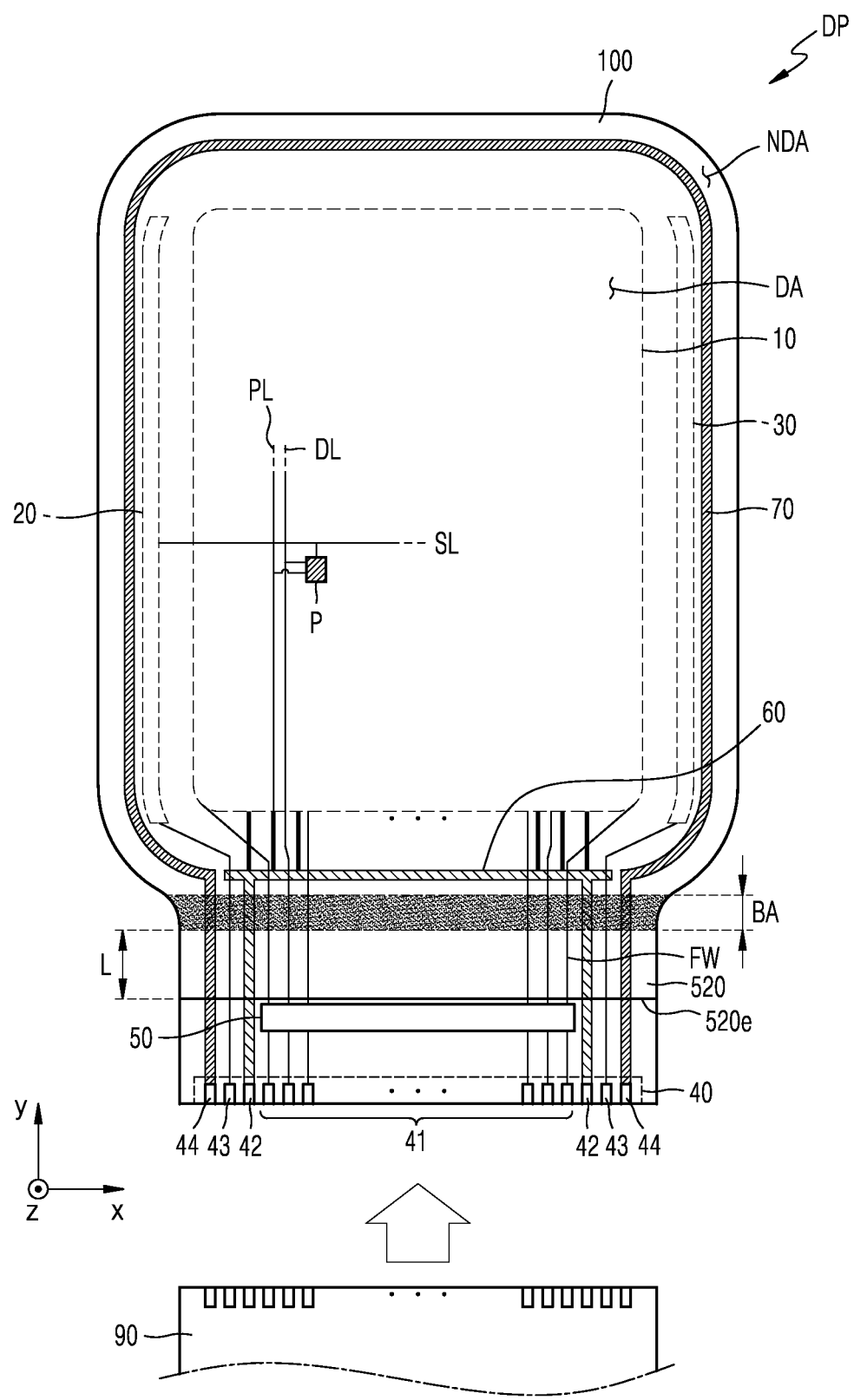
FIG. 5 is a plan view schematically showing a display panel of the display device of FIG. 1.
Figure 6:
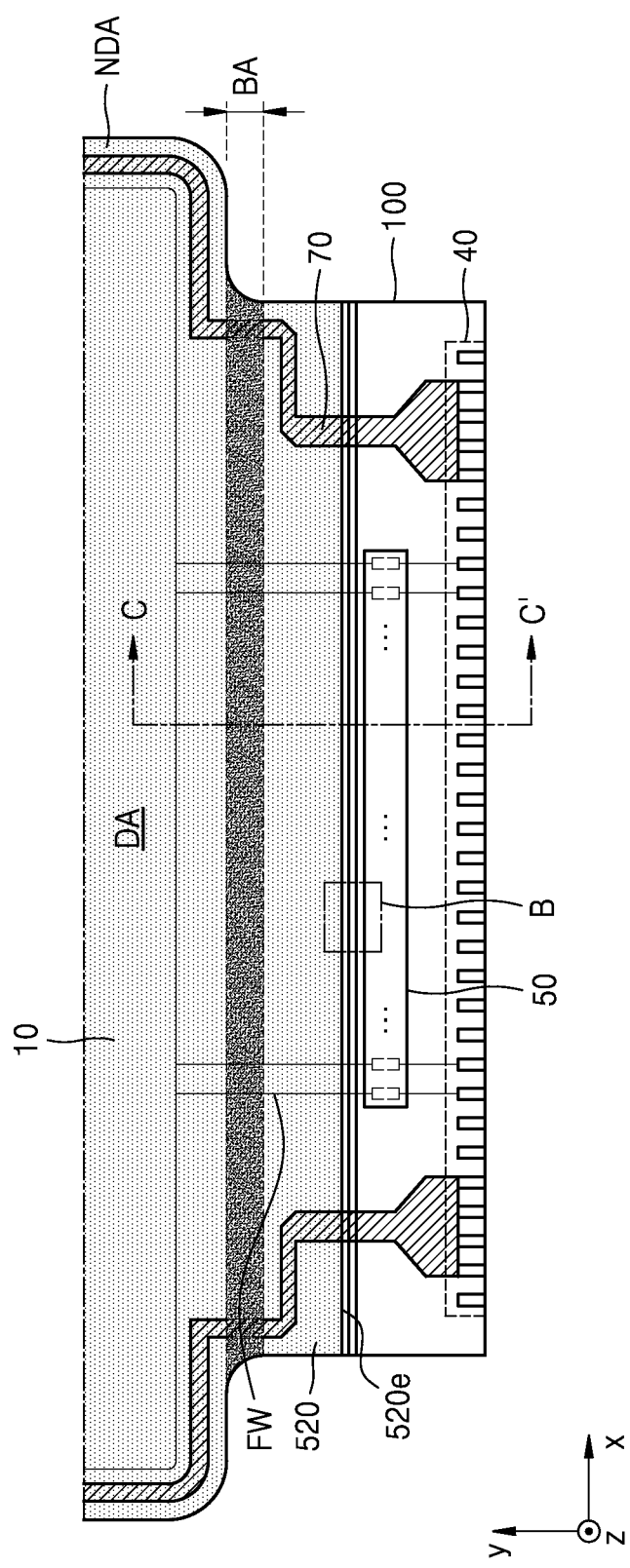
FIG. 6 is a plan view schematically showing a portion of the display panel of FIG. 5.
Figure 7:
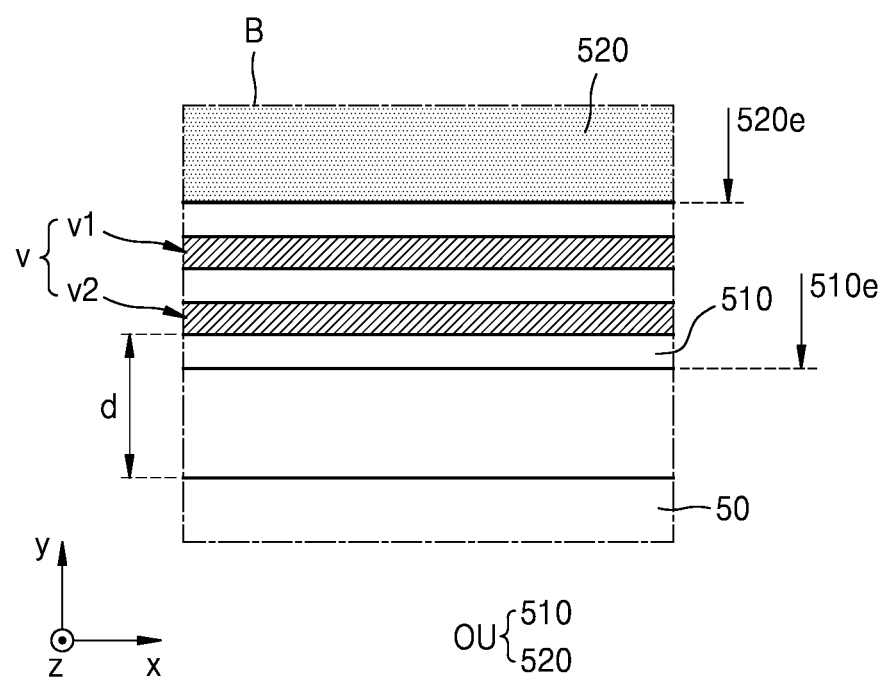
FIG. 7 is an enlarged view of a portion B of FIG. 6.

FIG. 5 is a plan view schematically showing the display panel DP of the display device 1 of FIG. 1, FIG. 6 is a plan view schematically showing a portion of the display panel DP of FIG. 5, and FIG. 7 is an enlarged view of a portion B of FIG. 6.

The display panel DP of FIG. 5 may be in a state before bending.

Referring to FIGS. 5 and 6, the display panel DP includes a display unit 10, a first scan driver 20, a second scan driver 30, a pad area 40, a driving circuit 50, a driving voltage supply line 60, and a common voltage supply line 70. Although not illustrated, an emission control driver (not shown) may be further arranged at one side of the first scan driver 20.

The substrate 100 may include a glass material or a material such as a metal or an organic material. According to an embodiment, the substrate 100 may include a flexible material. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

Obviously, various modifications are possible, for example, the substrate 100 may have a multi-layer structure including two layers each including a polymer resin, and a barrier layer arranged between the two layers and including an inorganic material such as silicon oxide, silicon nitride, or silicon oxynitride.

The substrate 100 may include the display area DA and the peripheral area NDA surrounding the display area DA.

A portion of the peripheral area NDA may extend in one side of the display area DA (for example, a −y direction). The pad area 40, driving circuit 50, driving voltage supply line 60, and a fanout wire FW may be arranged in the extended peripheral area NDA. The bending area BA may be disposed in a portion of the peripheral area NDA. For example, the bending area BA may be the extended portion of the peripheral area NDA. The bending area BA may bend such that the extended peripheral area NDA partially overlaps the display area DA, thereby reducing the width of the peripheral area NDA visible to a user.

The pixels P are arranged in the display area DA and connected to the scan lines SL extending in a first direction (for example, an x direction) and to the data line DLs and driving voltage lines PL extending in a second direction (for example, a y direction) crossing the first direction. Each pixel P emits, for example, red, green, blue, or white light, and may include the organic light-emitting diode OLED.

The display unit 10 is configured to provide a certain image through light emitted from the pixels P, and the display area DA is defined by an area in which the pixels P are disposed. The display unit 10 may have an approximately rectangular shape or according to some embodiments, may have a polygonal shape, a circular shape, an oval shape, or a shape partially corresponding thereto. According to an embodiment, the display unit 10 has a rectangular shape in overall, wherein each corner may include a curved rounded corner portion. The substrate 100 where such a display unit 10 is located may include curved edges on at least some regions of an outer edge.

The first scan driver 20 and the second scan driver 30 are arranged in the peripheral area NDA of the substrate 100, and are configured to generate a scan signal and transmit the same to each pixel P through the scan line SL. For example, the first scan driver 20 may be arranged at a left side of the display unit 10 and the second scan driver 30 may be arranged at a right side of the display unit 10. In the present embodiment, the first scan driver 20 and the second scan driver 30 are arranged on both sides of the display unit 10, but according to another embodiment, a scan driver may be arranged only at one side of the display unit 10.

The pad area 40 may be located in the peripheral area NDA of the substrate 100. Pads 41 through 44 may be disposed in the pad area 40. The pads 41 through 44 may be connected to a controller 90. The pad area 40 may be arranged at one end portion of the substrate 100, and electrically connected to the controller 90 through openings in an insulating layer. The controller 90 may be disposed on a printed circuit board, for example flexible printed circuit board (FPC).

The driving circuit 50 is arranged in the peripheral area NDA of the substrate 100 and configured to generate a data signals and transmit the same to each pixel P through the data lines DL. The driving circuit 50 may be arranged at one side of the display unit 10 and, for example, may be arranged between the pad area 40 and the display unit 10. Pads for accessing the driving circuit 50 are located on the substrate 100 and the driving circuit 50 may be connected to the data lines DL to transmit the data signals to the display panel DP. In FIG. 5, the driving circuit 50 is disposed on the peripheral area NDA, but according to another embodiment, the driving circuit unit 50 may be provided on a FPCB connected to the pad area 40.

A controller 90 is configured to change a plurality of image signals received from an external source into a plurality of image data signals, and transmit changed signals to the driving circuit 50 through the pads 41. Also, the driving circuit 50 is configured to generate a data signals, and the generated data signals may be transmitted to the display area DA through the fanout wires FW. Also, the controller 90 may be configured to generate, upon receiving a vertical synchronization signal, a horizontal synchronization signal, and a clock signal, a control signal for controlling operations of the first scan driver 20 and second scan driver 30, and transmit the same to the first scan driver 20 and second scan driver 30 through the pads 43. The controller 90 is configured to transmit the driving voltage ELVDD and a common voltage ELVSS to the driving voltage supply line 60 and the common voltage supply line 70 through the pads 42 and 44, respectively.

The driving voltage supply line 60 is arranged in the peripheral area NDA. For example, the driving voltage supply line 60 may be arranged between the driving circuit 50 and the display unit 10. The driving voltage supply line 60 is configured to provide the driving voltage ELVDD to the pixels P. The driving voltage supply line 60 may be arranged in the first direction (for example, the x direction) and connected to the plurality of driving voltage lines PL. A portion of the driving voltage supply line 60 may extend in the second direction (for example, the y direction) to be connected to the pad 42.

Figure 10:
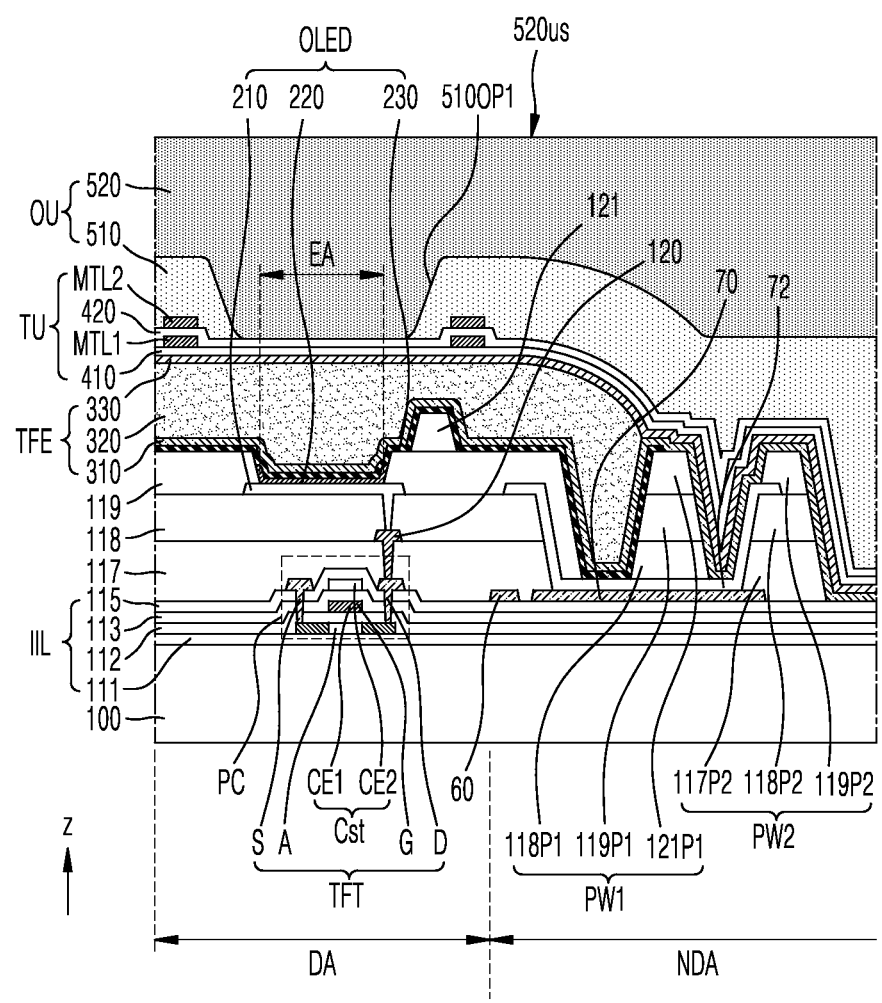
FIGS. 10 and 11 are cross-sectional views schematically showing a portion of a display device according to an embodiment.

The common voltage supply line 70 is arranged in the peripheral area NDA and configured to provide the common voltage ELVSS to an opposing electrode 230 of FIG. 10 of the organic light-emitting diode of the pixel P. For example, the common voltage supply line 70 may have a loop shape with one open side, and extend along an edge of the substrate 100 excluding an edge disposed adjacent to the pad area 40.

The optical functional layer OU may be arranged on an upper portion of the display area DA. The optical functional layer OU may be formed throughout an entire surface the display area DA and partially extend to the peripheral area NDA. Substantially, the optical functional layer OU is disposed on the input detection layer TU of FIGS. 2A and 3 described above, and may enhance light efficiency and side visibility of the pixel P on the display area DA.

As described in FIG. 3, the optical functional layer OU may include the first layer 510 and the second layer 520 having different refractive indexes, and in FIG. 5, a portion where the second layer 520 is arranged is illustrated.

The second layer 520 covers an entire surface of the display area DA, and a portion thereof may extend towards the peripheral area NDA. According to an embodiment, the second layer 520 may extend towards the peripheral area NDA to overlap the bending area BA of the substrate 100. The second layer 520 may cover the bending area BA and extend over the peripheral area NDA, but may not overlap the driving circuit 50. An end 520e of the second layer 520 may be located between the bending area BA and the driving circuit 50. Here, when the second layer 520 extends towards the peripheral area NDA, the end 520e of the second layer 520 may be provided to be adjacent to the driving circuit 50 as much as possible so as to sufficiently secure a width L extending from the bending area BA. For example, the width L between the bending area BA and end 520e of the second layer 520 may be secured to be at least about 1 mm or greater, and for example, may be about 4 mm to about 5 mm.

Referring to FIG. 7 together, as described above, the second layer 520 may cover the entire surface of the display area DA and a portion thereof may extend towards the peripheral area NDA, but not overlap the driving circuit 50. Accordingly, at least one valley V is provided between the driving circuit 50 and the end 520e of the second layer 520 in the first layer 510, thereby preventing the second layer 520 from extending to the driving circuit 50 to cover the driving circuit 50. For example, the valley V may include a first valley V1 and a second valley V2 which are spaced apart from each other.

The valley V may be provided as an insulating layer, for example, the first layer 510, located at a lower portion of the second layer 520 is patterned. For example, the valley V may be a removed portion of the first layer 510 located at the lower portion of the second layer 520. Accordingly, an end 510e of the first layer 510 may be arranged more adjacent to the driving circuit 50 than end 520e of the second layer 520.

Meanwhile, referring to FIG. 7, the valley V and the driving circuit 50 may be spaced apart from each other by a certain interval. For example, an interval d between the valley V and the driving circuit 50 may be 100 μm to 400 μm, in detail, 200 μm to 300 μm.

Figure 9A:
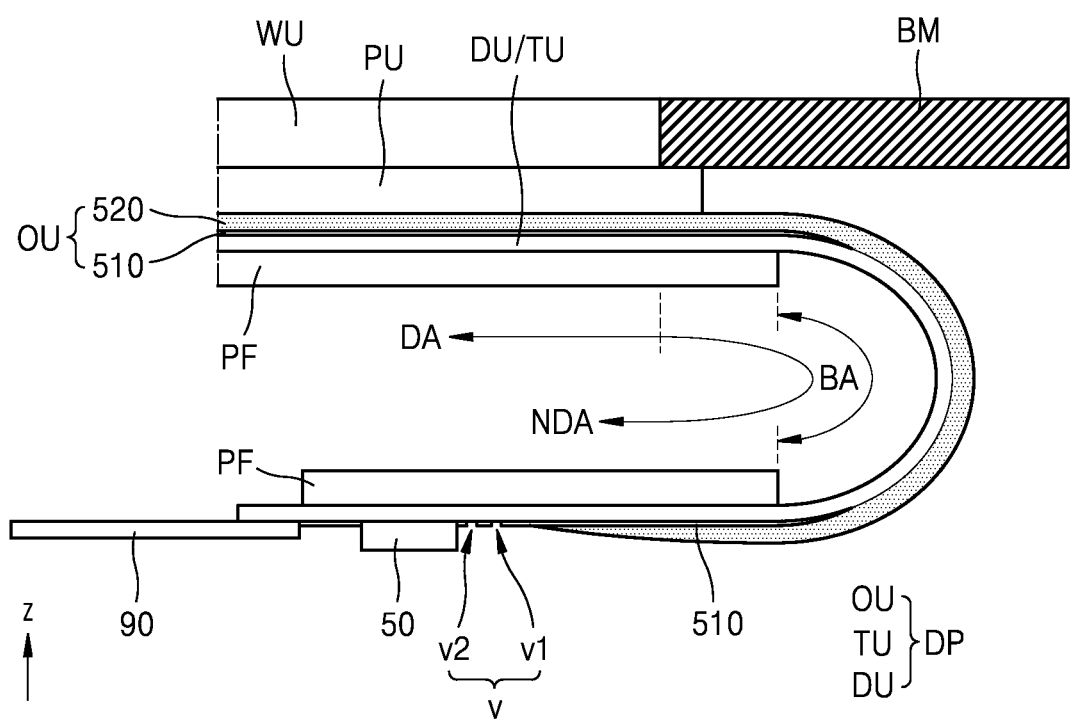
FIG. 9A is a cross-sectional view of a portion of a display device including a bent display panel.
Figure 9B:
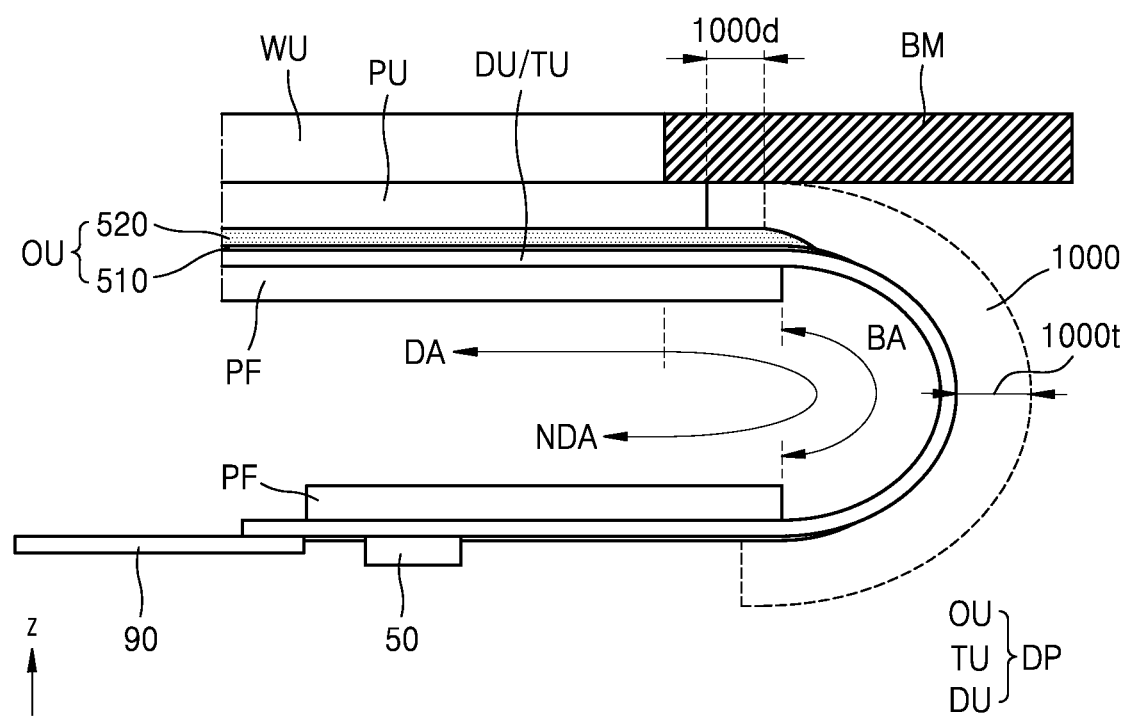
FIG. 9B is a cross-sectional view of a portion of a display device according to a comparative example.

FIG. 8 is a cross-sectional view of a portion of the display device 1 including a cross-section of the display panel DP taken along a line C-C' of FIG. 6, and FIG. 9A is a cross-sectional view of a portion of the display device 1 including the bent display panel DP. FIG. 9B is a cross-sectional view for describing a comparative example.

Referring to FIG. 8, the display panel DP may include the bending area BA at one side of the peripheral area NDA. FIG. 8 illustrates a state before the display panel DP is bent.

A protection film PF may be arranged on a bottom surface of the display panel DP. The protection film PF may be adhered to the bottom surface of the display panel DP, i.e., the substrate 100, through an adhesive layer. The protection film PF may be provided to protect the display panel DP from an external impact or from moisture or impurities that may penetrate through the substrate 100. The protection film PF is thicker and less flexible than the display panel DP, and thus a portion of the protection film PF, which corresponds to the bending area BA of the display panel DP, may be removed. The protection film PF may include an opening area PF-OP in an area corresponding to the bending area BA. Accordingly, the protection film PF is not arranged in the bending area BA, and thus the display panel DP may be easily bent as will be described in FIG. 8.

As described above with reference to FIG. 5, the driving circuit 50 may be arranged in the peripheral area NDA on the display panel DP and the controller 90 may be connected to the display panel in the peripheral area NDA.

As described above with reference to FIGS. 2A through 3, the display panel DP may include the display layer DU, the input detection layer TU, and the optical functional layer OU.

The optical functional layer OU may include the first layer 510 and the second layer 520. The optical functional layer OU may be located on a front surface of the display panel DP and may not overlap the driving circuit 50. In other words, the optical functional layer OU may extend from the display area DA to the peripheral area NDA but does not extend to cover the driving circuit 50.

The polarizing layer PU may be disposed on the optical functional layer OU.

Referring to FIG. 9A, the display panel DP may bend in the bending area BA. It may be understood that the display device 1 shown in FIG. 1 is a view of a structure of FIG. 9A in a −z direction. As shown in FIG. 9A, a portion of the peripheral area NDA of the display panel DP is bent in the bending area BA, thereby remarkably reducing the area of a non-display area visible to a user.

Meanwhile, when the display panel DP is bent, stress may be applied to the bending area BA. As described above with reference to FIG. 5, wires, such as the fanout wire FW, are disposed in the bending area BA, and the wires may be disconnected in the bending area BA due to cracks caused by the stress applied to the bending area BA.

Accordingly, in the display device 1 according to an embodiment, a neutral plane is raised up to an upper organic layer of the wires by arranging the second layer 520 in an upper portion of the display panel DP, thereby reducing the stress concentrated on the wires in the bending area BA.

The second layer 520 extends from the display area DA to the peripheral area NDA and may completely cover the bending area BA. The second layer 520 may be arranged not to completely traverse the valley V located between the driving circuit 50 and the bending area BA. A thickness of the second layer 520 is gradually reduced in the bending area BA, and the second layer 520 may end at the valley V or at a point between the valley V and the bending area BA.

The valley V may be a removed portion of the first layer 510 which is located immediately below the second layer 520. This will be described in detail with reference to FIG. 11 below.

The window layer WU may be disposed on the polarizing layer PU. The polarizing layer PU is not arranged in the bending area BA, and may be generally arranged in the display area DA and a portion thereof may extend towards the peripheral area NDA. The window layer WU may be arranged in an area corresponding to the polarizing layer PU, and may be generally arranged in the display area DA and a portion thereof may extend towards the peripheral area NDA.

A light-shielding portion BM may be arranged in the peripheral area NDA at one side of the window layer WU. The light-shielding portion BM may be provided as a separate component or may be provided by coating a light-shielding material on a portion of the window layer WU. The peripheral area NDA is a non-display area, and thus the light-shielding portion BM may be arranged on an upper portion thereof to prevent an unnecessary region from being visible to a user. When the display panel DP is bent as shown in FIG. 9A, the valley V may not overlap the light-shielding portion BM, and may overlap the window layer WU.

The bending area BA overlaps the light-shielding portion BM, and an additional layer or structure may not be arranged between the second layer 520 and the light-shielding portion BM. For example, an empty space may remain between the second layer 520 and the light-shielding portion BM, and the empty space may be in a vacuum state or an air layer.

Meanwhile, referring to FIG. 9B as a comparative example, a material layer μ0 may be arranged in the bending area BA. The material layer 1000 may be disposed on the substrate μ of FIG. 3. The material layer 1000 may raise the location of the neutral plane in the bending area BA, thereby reducing stress concentrated on the wires in the bending area BA. However, the material layer 1000 needs to be formed through a separate process and have a thickness sufficient to raise the neutral plane, and thus a thickness 1000t thereof is relatively thick compared to other layers and a tolerance margin 1000d with the polarizing layer PU needs to be about twice greater than the thickness 1000t so as to form the material layer 1000. Accordingly, when the material layer 1000 is formed, a width of the peripheral area NDA visible to a user is increased.

In this regard, in the display device 1 according to an embodiment, instead of forming the material layer 1000, the second layer 520 may extend up to the bending area BA to replace a function of the material layer 1000, as shown in FIG. 9A. When the second layer 520 extends up to the bending area BA, the neutral plane may be raised without a separate additional process, and a width corresponding to the thickness 1000t and the tolerance margin 1000d of the material layer 1000 may decrease, and thus the peripheral area NDA visible to a user may be effectively reduced by at least about 200 μm.

Figure 11:
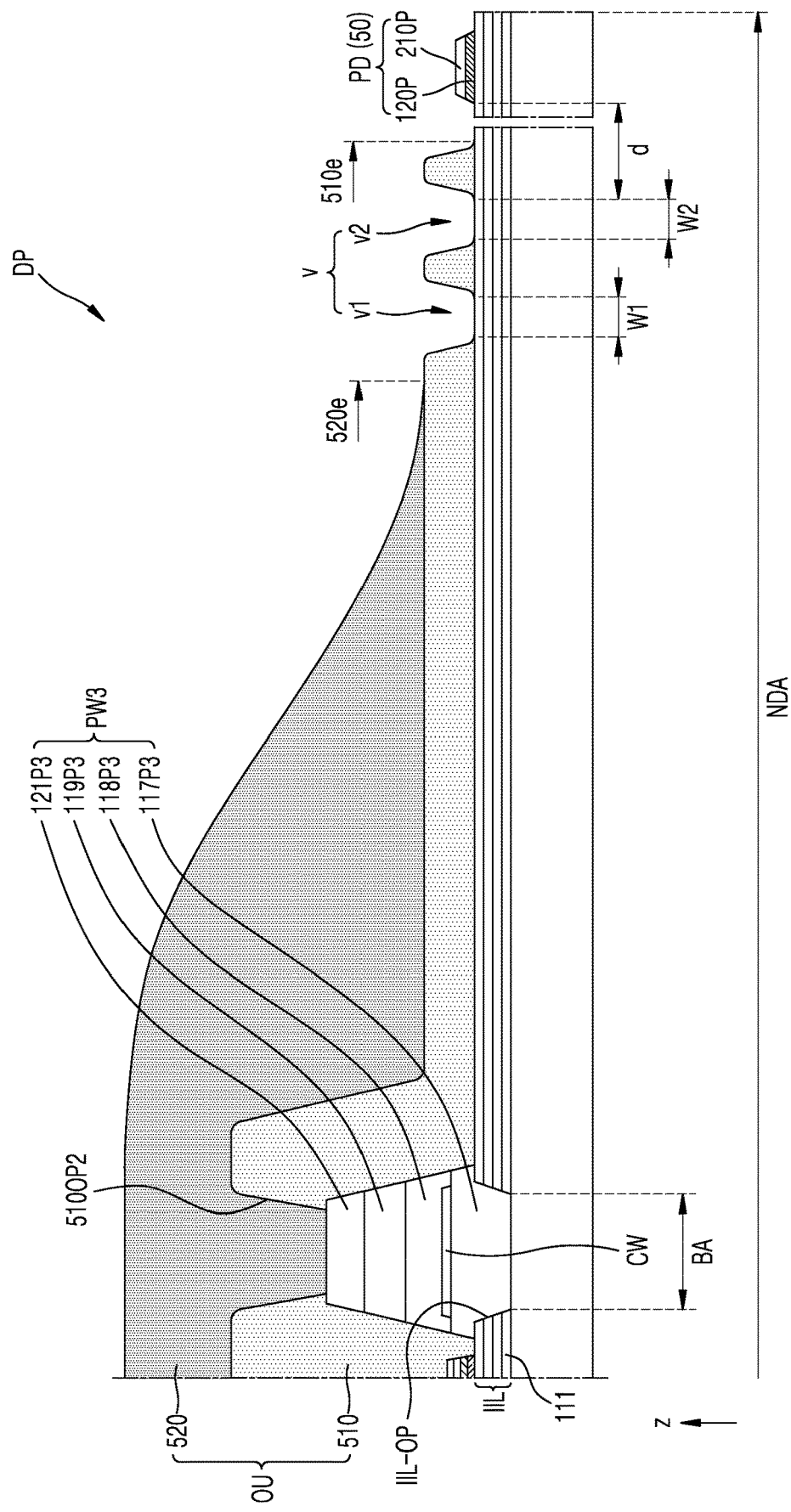

FIGS. 10 and 11 are cross-sectional views schematically showing a portion of the display device 1 according to an embodiment.

FIG. 10 illustrates portions of the display area DA and the peripheral area NDA disposed adjacent to the display area DA, and FIG. 11 illustrates a portion of the peripheral area NDA including the bending area BA. Hereinafter, a structure of the display area DA will be described first with reference to FIG. 10.

A buffer layer 111 may be disposed on the substrate 100. The buffer layer 111 may prevent impurities from being introduced, through the substrate 100, to various devices arranged on the substrate 100.

The pixel circuit PC including a thin-film transistor TFT and the storage capacitor Cst may be disposed on the buffer layer 111. The thin-film transistor TFT may include a semiconductor layer A, a gate electrode G overlapping a channel region of the semiconductor layer A, and a source electrode S and drain electrode D respectively connected to a source region and drain region of the semiconductor layer A. A gate insulating layer 112 may be arranged between the semiconductor layer A and the gate electrode G. A first interlayer insulating layer 113 and a second interlayer insulating layer 115 may be arranged between the gate electrode G and the source electrode S and between the gate electrode G and the drain electrode D.

The buffer layer 111, gate insulating layer 112, first interlayer insulating layer 113, and second interlayer insulating layer 115 may be inorganic material layers to form an inorganic insulating layer IIL.

The storage capacitor Cst may overlap the thin-film transistor TFT. The storage capacitor Cst may include a first capacitor plate CE1 and a second capacitor plate CE2 which overlap each other. According to an embodiment, the gate electrode G of the thin-film transistor TFT may be the first capacitor plate CE1 of the storage capacitor Cst. The first interlayer insulating layer 113 may be arranged between the first capacitor plate CE1 and the second capacitor plate CE2.

The semiconductor layer A may include the channel region, and the source region and drain region where impurities are doped. According to an embodiment, the semiconductor layer A may include a silicon semiconductor material. According to an embodiment, the semiconductor layer A may include polysilicon or amorphous silicon. According to an embodiment, the semiconductor layer A may include an oxide semiconductor material. According to an embodiment, the pixel circuit PC may include the plurality of thin-film transistors TFT, wherein some of the plurality of thin-film transistors TFT may include a silicon semiconductor material and the remaining thin-film transistors TFT may include an oxide semiconductor material. When the semiconductor layer A includes an oxide semiconductor material, the semiconductor layer A may include, for example, an oxide of at least one material selected from the group consisting of indium (In), gallium (Ga), tin (Sn), zirconium (Zr), hafnium (Hf), titanium (Ti), and zinc (Zn).

The gate insulating layer 112 may include an inorganic insulating material, such as silicon oxide, silicon oxynitride, or silicon nitride, and may have a single-layer or multi-layer structure including such a material.

The gate electrode G or the first capacitor plate CE1 may include a low-resistance conductive material such as molybdenum (Mo), aluminum (Al), copper (Cu), and/or titanium (Ti), and may have a single-layer or multi-layer structure including such a material.

The first interlayer insulating layer 113 may include an inorganic insulating material, such as silicon oxide, silicon oxynitride, or silicon nitride, and may have a single-layer or multi-layer structure including such a material.

The second capacitor plate CE2 may include aluminum (Al), chromium (Cr), molybdenum (Mo), titanium (Ti), tungsten (W), and/or copper (Cu), and may have a single-layer or multi-layer structure including such a material.

The second interlayer insulating layer 115 may include an inorganic insulating material, such as silicon oxide, silicon oxynitride, or silicon nitride, and may have a single-layer or multi-layer structure including such a material.

The source electrode S or drain electrode D may include aluminum (Al), molybdenum (Mo), titanium (Ti), tungsten (W), and/or copper (Cu), and may have a single-layer or multi-layer structure including such a material. For example, the source electrode S or drain electrode D may have a three-layer structure of titanium layer/aluminum layer/titanium layer.

A first planarization insulating layer 117 may be disposed on the inorganic insulating layer IIL arranged therebelow, for example, the buffer layer 111, gate insulating layer 112, first interlayer insulating layer 113, second interlayer insulating layer 115, and another material. The first planarization insulating layer 117 may include an organic insulating material such as acryl, benzo cyclobutene (BCB), polyimide, or hexamethyldisiloxane (HMDSO).

A second planarization insulating layer 118 may be disposed on the first planarization insulating layer 117. The second planarization insulating layer 118 may include an organic insulating material such as acryl, benzo cyclobutene (BCB), polyimide, or hexamethyldisiloxane (HMDSO). A contact metal 120 is disposed on the first planarization insulating layer 117, and the thin-film transistor TFT and a pixel electrode 210 may be electrically connected to each other through the contact metal 120.

The organic light-emitting diode OLED as a display element may be disposed on the second planarization insulating layer 118. The organic light-emitting diode OLED includes the pixel electrode 210, the intermediate layer 220, and the opposing electrode 230.

The pixel electrode 210 may be disposed on the second planarization insulating layer 118. The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 210 may include the reflective layer including such a material and a transparent conductive layer on and/or below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the pixel electrode 210 may have a three-layer structure of ITO layer/Ag layer/ITO layer that are sequentially stacked.

A pixel-defining layer 119 may include an opening exposing a center of the pixel electrode 210. The pixel-defining layer 119 may cover edges of the pixel electrode 210. The pixel-defining layer 119 may include an organic insulating material such as benzo cyclobutene (BCB), polyimide, or hexamethyldisiloxane (HMDSO). An emission region EA may be defined by the opening in the pixel-defining layer 119, and red, green, or blue light may be emitted through the emission region EA. The area or width of the emission region EA may define the area or width of a visible pixel P.

A spacer 121 may be formed on the pixel-defining layer 119. The spacer 121 may prevent damage to layers below the spacer 121 caused by a mask during a process of forming an intermediate layer 220 or the like described below. According to an embodiment, the spacer 121 may include a same material as or a different material from the pixel-defining layer 119. For example, when the spacer 121 includes a same material as the pixel-defining layer 119, the spacer 121 and the pixel-defining layer 119 may be integrally formed by using a half-tone mask.

The intermediate layer 220 includes an emission layer overlapping the pixel electrode 210. The emission layer may include an organic material. The emission layer may include a high-molecular weight organic material or low-molecular weight organic material which emit a light of certain color. The emission layer may be formed through a deposition process using a mask as described above.

A first functional layer and a second functional layer may be respectively disposed below and/or above the emission layer. According to an embodiment, unlike the emission layer which is patterned and arranged for each pixel P, the first functional layer and the second functional layer may be integrally provided throughout an entire surface of the display area DA.

The first functional layer may be a single layer or multiple layers. For example, when the first functional layer is formed of a polymer material, the first functional layer is a hole transport layer (HTL) having a single-layer structure and may include poly-(3,4)-ethylene-dihydroxy thiophene (PEDOT) or polyaniline. When the first functional layer is formed of a low-molecular weight material, the first functional layer may include a hole injection layer (HIL) and the HTL.

The second functional layer may be optional. For example, when the first functional layer and the emission layer are formed of a polymer material, the second functional layer may be formed. The second functional layer may be a single layer or multiple layers. The second functional layer may include an electron transport layer (ETL) and/or an electron injection layer (EIL).

The opposing electrode 230 may include a conductive material with a relatively low work function. For example, the opposing electrode 230 may include a (semi-)transparent layer including silver (Ag), magnesium (Mg), aluminum (Al), nickel (Ni), chromium (Cr), lithium (Li), calcium (Ca), or an alloy thereof. The opposing electrode 230 may further include a layer including ITO, IZO, ZnO, or $In_2O_3$ disposed on the (semi-)transparent layer including such a material. According to an embodiment, the opposing electrode 230 may include Ag and Mg.

A stack structure of the pixel electrode 210, the intermediate layer 220, and the opposing electrode 230, which are sequentially stacked, may form a light-emitting diode, for example, the organic light-emitting diode OLED. The organic light-emitting diode OLED may be sealed by the thin-film encapsulation layer TFE.

The thin-film encapsulation layer TFE may include a first inorganic encapsulation layer 310 and a second inorganic encapsulation layer 330, and the organic encapsulation layer 320 disposed therebetween.

The first inorganic encapsulation layer 310 and the second inorganic encapsulation layer 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first inorganic encapsulation layer 310 and the second inorganic encapsulation layer 330 may be formed via a chemical vapor deposition method.

The organic encapsulation layer 320 may include a polymer-based material. Examples of the polymer-based material may include an acrylic resin, an epoxy resin, polyimide, and polyethylene. For example, the organic encapsulation layer 320 may include acrylic resin such as polymethyl methacrylate, polyacrylic acid, or the like. The organic encapsulation layer 320 may be formed by curing monitor or applying polymer.

The thin-film encapsulation layer TFE may be arranged to cover all of the display area DA and cover a portion of the peripheral area NDA by extending towards the peripheral area NDA. The thin-film encapsulation layer TFE may extend up to an outer region of the driving voltage supply line 60.

The input detection layer TU may include the first conductive layer MTL1 and the second conductive layer MTL2 which include a detection electrode and/or a trace line. The first inorganic insulating layer 410 may be arranged between the thin-film encapsulation layer TFE and the first conductive layer MTL1, and the second inorganic insulating layer 420 may be arranged between the first conductive layer MTL1 and the second conductive layer MTL2.

The first conductive layer MTL1 and the second conductive layer MTL2 may include a conductive material. The conductive material may include Mo, Al, Cu, or Ti, and may be formed in multiple layers or a single layer including such a material. According to some embodiments, the first conductive layer MTL1 and the second conductive layer MTL2 may have a structure in which a titanium layer, an aluminum layer, and a titanium layer (Ti/Al/Ti) are sequentially stacked.

The first inorganic insulating layer 410 and the second inorganic insulating layer 420 may include an inorganic insulating material and/or an organic insulating material. The inorganic insulating material may include silicon oxide, silicon oxynitride, or silicon nitride. The organic insulating material may include an acryl-based or imide-based organic material.

The optical functional layer OU may be disposed on the input detection layer TU. The optical functional layer OU may include the first layer 510 disposed on the second inorganic insulating layer 420 and covering the second conductive layer MTL2, and the second layer 520 disposed on the first layer 510. The first layer 510 and the second layer 520 are arranged in the display area DA, and may extend towards the peripheral area NDA while entirely covering the display area DA.

The first layer 510 may include an opening pattern 510OP1 corresponding to the emission region EA. According to an embodiment, a width of the opening pattern 510OP1 may be greater than a width of the emission region EA. The opening pattern 510OP1 is located in a light extraction direction of a pixel P to reinforce straightness of light emitted from the emission region EA, thereby enhancing light extraction efficiency.

To further enhance the light extraction efficiency, the second layer 520 having a refractive index greater than that of the first layer 510 may be further disposed on the first layer 510. The first layer 510 may include an insulating material having a first refractive index and the second layer 520 may include an insulating material having a second refractive index.

The first refractive index of the first layer 510 may be in a range of about 1.3 to about 1.6. According to an embodiment, the first refractive index of the first layer 510 may be in a range of about 1.4 to about 1.55. The first layer 510 may include, for example, (ethyl)hexyl acrylate, pentafluoropropyl acrylate, poly(ethylene glycol) dimethacrylate, or ethylene glycol dimethacrylate. According to an embodiment, the first layer 510 may include an acryl-based organic material having a refractive index of about 1.5. In addition, the first layer 510 may be formed of a material forming the organic encapsulation layer 320 of the thin-film encapsulation layer TFE. According to an embodiment, the first layer 510 may include an epoxy-based organic material, and in some cases, may also include a photopolymer material.

The second layer 520 may have the second refractive index. The second refractive index of the second layer 520 may be in a range of about 1.60 to about 1.85. The second layer 520 may include, for example, polydiarylsiloxane, methyltrimethoxysilane, or tetramethoxysilane. According to an embodiment, the second layer 520 may include an acryl-based and/or siloxane-based organic material having a refractive index of about 1.6. According to another embodiment, the second layer 520 may include distributed particles for a high refractive index. In the second layer 520, metal oxide particles, such as zinc oxide ($ZnO_x$), titanium oxide ($TiO_2$), zirconium oxide ($ZrO_2$), or barium titanate ($BaTiO_3$), may be distributed.

The second layer 520 is arranged in the display area DA to cover the first layer 510, and may extend towards the peripheral area NDA while entirely covering the display area DA. The second layer 520 is arranged throughout an entire surface of the display area DA, and thus the second layer 520 may have at least certain light transmittance. According to an embodiment, light transmittance of the second layer 520 may be at least 90%, 95%, or 98%.

Here, the second layer 520 may be provided as a planarization layer having an approximately flat top surface in the display area DA and a portion of the peripheral area NDA extending from the display area DA. An average thickness of the second layer 520 is greater than thicknesses of layers arranged at a lower portion of the second layer 520, and thus the top surface of the second layer 520 may be flattened without being affected by profiles of the layers disposed at the lower portion of the second layer 520. When the top surface of the second layer 520 is approximately flat, the polarizing layer PU of FIG. 9A and the like on the second layer 520 may be easily arranged in the display area DA.

Referring to the peripheral area NDA, a first barrier rib PW1 and a second barrier rib PW2 may be arranged in the peripheral area NDA adjacent to the display area DA. The first barrier rib PW1 and the second barrier rib PW2 may be arranged to surround the display area DA. Also, the first barrier rib PW1 and the second barrier rib PW2 may be spaced apart from each other. The first barrier rib PW1 and the second barrier rib PW2 may prevent the organic encapsulation layer 320 of the thin-film encapsulation layer TFE from overflowing towards an edge of the substrate 100.

The organic encapsulation layer 320 may contact the first inorganic encapsulation layer 310 covering an inner side surface of the first barrier rib PW1 facing the display area DA. Here, the organic encapsulation layer 320 directly contacting the first inorganic encapsulation layer 310. The first inorganic encapsulation layer 310 and the second inorganic encapsulation layer 330 are disposed on the first barrier rib PW1 and the second barrier rib PW2, and may extend toward the edge of the substrate 100.

In FIG. 10, the display device 1 includes the first barrier rib PW1 and the second barrier rib PW2, but according to another embodiment, the display device 1 may include only the first barrier rib PW1 or may further include a barrier rib adjacent to the second barrier rib PW2. The first barrier rib PW1 may include a portion 118P1 of the second planarization insulating layer 118, a portion 119P1 of the pixel-defining layer 119, and a portion 121P1 of the spacer 121, and the second barrier rib PW2 may include a portion 117P2 of the first planarization insulating layer 117, a portion 118P2 of the second planarization insulating layer 118, and a portion 119P2 of the pixel-defining layer 119. According to another embodiment, the first barrier rib PW1 and the second barrier rib PW2 may further include portions of other layers, or some of the above layers may be omitted.

The common voltage supply line 70 may be located outside the driving voltage supply line 60. The common voltage supply line 70 may overlap first barrier rib PW1 and the second barrier rib PW2. The common voltage supply line 70 may be electrically connected to the opposing electrode 230 of the organic light-emitting diode OLED through a connecting electrode 72. According to an embodiment, the common voltage supply line 70 may be disposed on a same layer as the driving voltage supply line 60 and may include a same material as the source electrode S of the thin-film transistor TFT, and the connecting electrode 72 may include a same material as the pixel electrode 210 of the organic light-emitting diode OLED.

The first layer 510 and second layer 520 of the optical functional layer OU may extend to the peripheral area NDA and overlap the first barrier rib PW1 and second barrier rib PW2. A top surface of the second layer 520 may be approximately flat even on upper portions of the first barrier rib PW1 and second barrier rib PW2.

Meanwhile, referring to FIG. 11, at least a portion of the peripheral area NDA may include the bending area BA. Hereinafter, a structure of the peripheral area NDA will be described with reference to FIGS. 10 and 11.

The bending area BA may be spaced apart from the first barrier rib PW1 and the second barrier rib PW2 described with reference to FIG. 9A.

According to an embodiment, the inorganic insulating layer IIL may include an opening portion IIL-OP in an area corresponding to the bending area BA. In other words, the inorganic insulating layer IIL in the area corresponding to the bending area BA may be removed. In FIG. 11, the inorganic insulating layer IIL in the area corresponding to the bending area BA is entirely removed, but according to another embodiment, a portion or all of the buffer layer 111 may remain without being removed. As such, by removing a portion or all of the inorganic insulating layer IIL located in the bending area BA, the inorganic insulating layer IIL disposed in the bending area BA may be prevented from being cracked during bending or a generated crack may be prevented from spreading to a connecting wire CW.

A barrier rib layer PW3 may be located in the bending area BA. As described above, when an inorganic layer is located in the bending area BA, the inorganic layer may be cracked, and thus the barrier rib layer PW3 may generally include an organic insulating material. According to an embodiment, the barrier rib layer PW3 may include a portion 117P3 of the first planarization insulating layer 117 of FIG. 10, a portion 118P3 of the second planarization insulating layer 118 of FIG. 10, a portion 119P3 of the pixel-defining layer 119 of FIG. 10, and a portion 121P3 of the spacer 121 of FIG. 10.

The connecting wire CW may be arranged in the bending area BA. The connecting wire CW may be a portion of the fanout wire FW of FIG. 5. The fanout wire FW may transmit a data signal to each pixel P through the connecting wire CW located in the bending area BA. According to an embodiment, the connecting wire CW may be arranged between a first organic layer that is the portion 117P3 of the first planarization insulating layer 117 and a second organic layer that is the portion 118P3 of the second planarization insulating layer 118, and, in this case, the connecting wire CW may include a same material as the contact metal 120 of FIG. 10. According to another embodiment, the connecting wire CW may include a same material as the source electrode S of the thin-film transistor TFT. A metal layer configuring the connecting wire CW may have an excellent tensile force compared to the fanout wire FW arranged in the peripheral area NDA excluding the bending area BA. According to an embodiment, the fanout wire FW arranged in the peripheral area NDA excluding the bending area BA may include a same material as the gate electrode G of the thin-film transistor TFT or the second capacitor plate CE2 of the storage capacitor Cst.

Unlike that shown in FIG. 11, the first inorganic encapsulation layer 310 and second inorganic encapsulation layer 330 of the thin-film encapsulation layer TFE may extend up to the barrier rib layer PW3. According to an embodiment, end portions of the first inorganic encapsulation layer 310 and second inorganic encapsulation layer 330 may be arranged over the barrier rib layer PW3 or located on the barrier rib layer PW3.

The driving circuit 50 may be located in the peripheral area NDA of the substrate 100. The driving circuit 50 may include pads PD for accessing an IC chip or the like. The pad PD may be provided as a double layer including a first conductive layer 120P and a second conductive layer 210P. For example, first conductive layer 120P may include a same material as the contact metal 120 and the second conductive layer 210P may include a same material as the pixel electrode 210, but the disclosure is not limited thereto. In FIG. 11, the pad PD is entirely exposed on the inorganic insulating layer IIL, but according to some embodiments, edges of the first conductive layer 120P and second conductive layer 210P of the pad PD may be covered by an insulating layer and exposed by an opening in the insulating layer.

Meanwhile, the optical functional layer OU may extend towards the peripheral area NDA while covering the barrier rib layer PW3. The optical functional layer OU may be arranged up to a portion adjacent to the driving circuit 50 located in the peripheral area NDA.

The first layer 510 of the optical functional layer OU may include at least one valley V located between the driving circuit 50 and the bending area BA. The at least one valley V may be arranged adjacent to the driving circuit 50 as shown in FIG. 11. The valley V and the driving circuit 50 may be spaced apart from each other by a certain interval. For example, the interval d between the valley V and the driving circuit 50 may be 100 μm to 400 μm, in detail, 200 μm to 300 μm.

According to an embodiment, as shown in FIG. 11, the valleys V may include the first valley V1 and the second valley V2, which are spaced apart from each other, but the disclosure is not necessarily limited thereto. The number of valleys V may be one or three or more depending on a design. According to an embodiment, widths W1 and W2 of the first valley V1 and second valley V2, respectively, may be about 5 μm to about 30 μm or about 10 μm to about 20 μm. For example, the width W1 of the first valley V1 and the width W2 of the second valley V2 may be the same. In some cases, the width W1 of the first valley V1 and the width W2 of the second valley V2 may be different from each other. For example, the width W1 of the first valley V1 may be greater than the width W2 of the second valley V2. As such, when the at least one valley V is provided at an end portion of the first layer 510, the second layer 520 disposed on the first layer 510 may be prevented from overflowing towards the driving circuit 50 over the valley V.

The first layer 510 may include an opening 510OP2 in an area corresponding to the bending area BA. The opening 510OP2 may be disposed on the barrier rib layer PW3. A top surface of the barrier rib layer PW3, i.e., a top surface of the portion 121P3 of the spacer 121 of FIG. 10, may be exposed through the opening 510OP2.

The second layer 520 may be disposed on the first layer 510. The first layer 510 and the second layer 520 may be defined as the optical functional layer OU. The second layer 520 may cover the first layer 510. Referring to FIGS. 10 and 11, the second layer 520 may be arranged over not only the display area DA, but also a portion of the peripheral area NDA. The second layer 520 arranged in the display area DA has a different refractive index from the first layer 510, thereby enhancing light output of light emitted from a light-emitting device.

The second layer 520 may be arranged over a portion of the peripheral area NDA, and cover the bending area BA. As shown in FIG. 11, the second layer 520 may be arranged to cover the opening 510OP2 of the first layer 510 formed in the area corresponding to the bending area BA. The second layer 520 may fill the opening 510OP2 of the first layer 510 and may directly contact a top surface of the barrier rib layer PW3 exposed by the opening 510OP2.

As such, when the second layer 520 is arranged to cover the bending area BA, a neutral plane of the bending area BA is moved upward and moduli of layers arranged in the area corresponding to the bending area BA are compensated for, thereby relaxing stress applied to the bending area BA. By extending the second layer 520 arranged in the display area DA up to a portion of the peripheral area NDA (including the bending area BA) without a separate additional process, manufacturing processes may be simplified and manufacturing costs may be reduced.

According to an embodiment, the second layer 520 may have a modulus of 0.2 GPa to 1.5 GPa. Also, according to an embodiment, the second layer 520 may have elongation of 10% or greater. When the second layer 520 has the modulus of 0.02 GPa to 1.5 GPa and the elongation of 10% or greater, required mechanical properties of the disclosure may be secured and stress relaxation on the bending area BA may be further facilitated. To secure such mechanical properties, for example, the second layer 520 may include about 5% to about 40% of difunction acrylate monomers.

Also, the second layer 520 is also arranged in the display area DA as described with reference to FIG. 10, and, thus, optical properties for overall coating on the substrate 100 is satisfied. For example, light transmittance of the second layer 520 may be at least 90%, 95%, or 98%. Also, the second layer 520 may include a material having a haze of 0.2% or less.

The second layer 520 may be formed through, for example, an inkjet method or a deposition method, but an embodiment is not limited thereto. The second layer 520 may be formed through another well-known manufacturing method.

As shown in FIGS. 10 and 11, a top surface 520us of the second layer 520 is provided approximately flat in the display area DA, and may extend up to the peripheral area NDA adjacent to the display area DA. The top surface 520us of the second layer 520 may be provided flat in the area corresponding to the bending area BA. The top surface 520us of the second layer 520 disposed between the bending area BA and the valley inclines towards the valley V, and accordingly, the thickness of the second layer 520 may gradually decrease towards the end 520e of the second layer 520.

Figure 12:
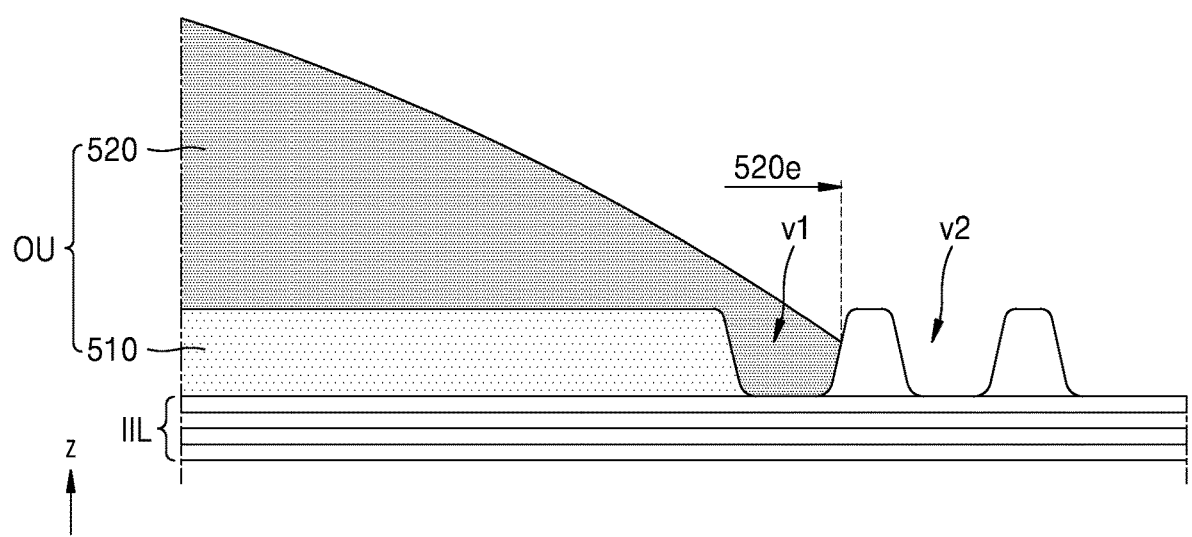
FIGS. 12 through 14 illustrate modified embodiments of FIG. 11;)
Figure 13:
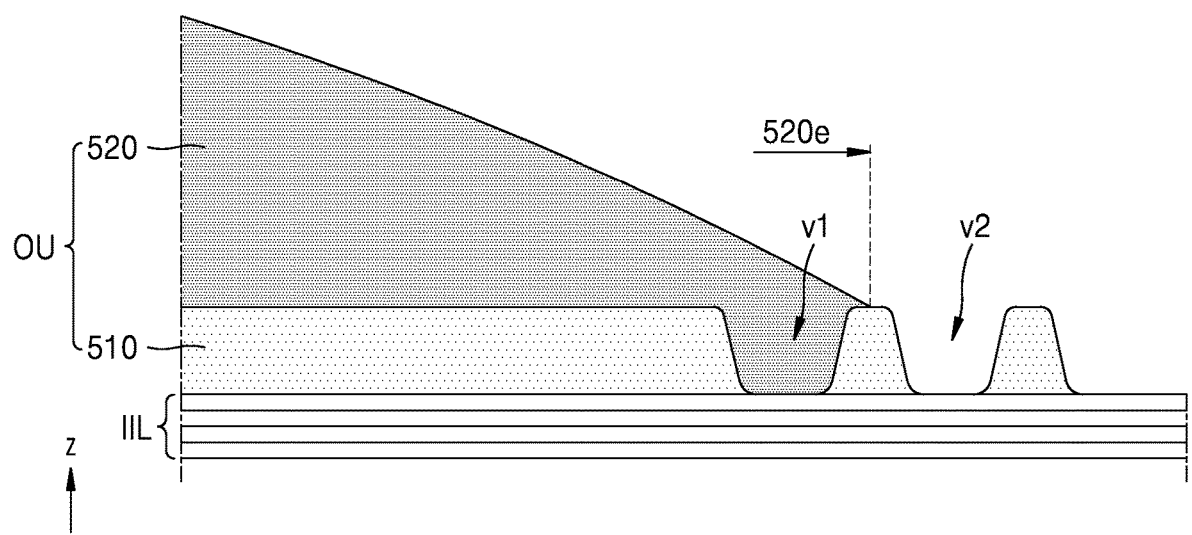
Figure 14:
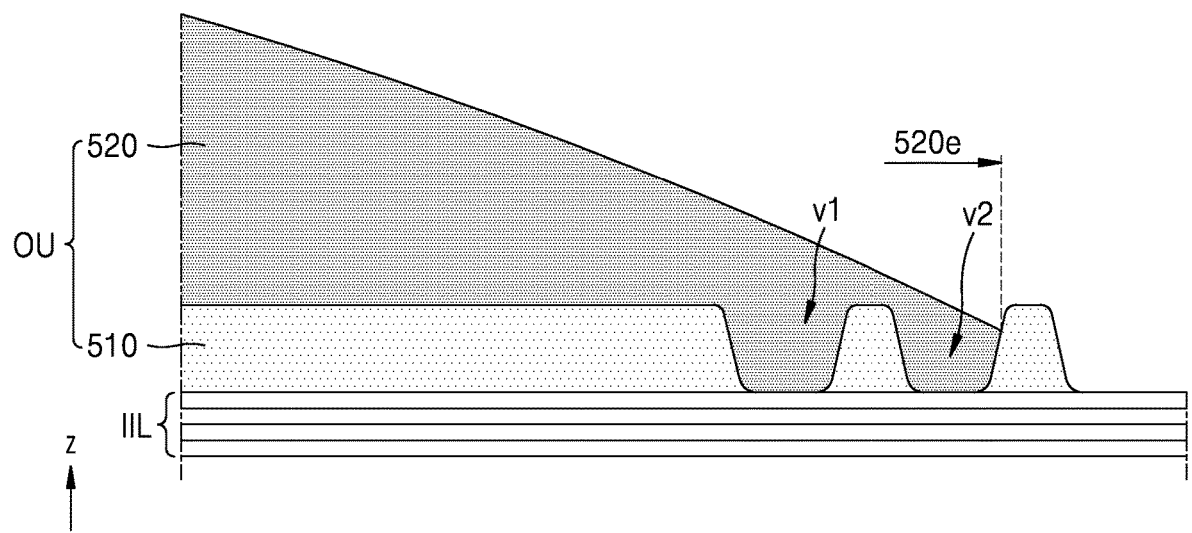

According to an embodiment, the end 520e of the second layer 520 ends before the first valley V1 in FIG. 11, but the disclosure is not necessarily limited thereto. Substantially, the valley V may prevent the second layer 520 from overflowing to the driving circuit 50, and thus it is enough for the second layer 520 not to completely traverse the second valley V2 disposed adjacent to the driving circuit 50. Thus, according to other embodiments, the end 520e of the second layer 520 may be located in the first valley V1 as shown in FIG. 12, the end 520e of the second layer 520 may be located between the first valley V1 and the second valley V2 as shown in FIG. 13, or the end 520e of the second layer 520 may be located in the second valley V2 as shown in FIG. 14.

As described above, the top surface 520us of the second layer 520 may be provided approximately flat in the display area DA and a portion of the peripheral area NDA including the bending area BA. As shown in FIGS. 11 and 12, a bottom surface of the second layer 520 may be formed along contour of lower layers even in a portion where the top surface 520us of the second layer 520 is flat, and an average thickness of the second layer 520 may be about 10 μm to about 30 μm based on a portion where the top surface 520us of the second layer 520 is flat.

Figure 15:
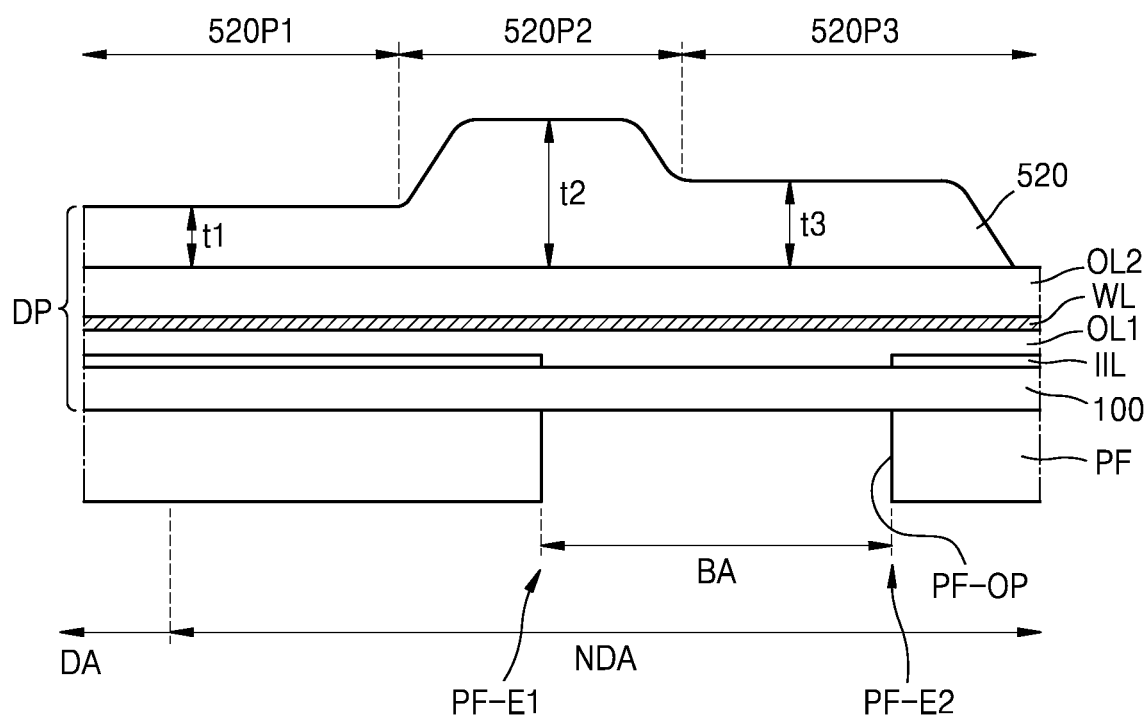
FIGS. 15 and 16 are cross-sectional views schematically showing a portion of a display device according to an embodiment.
Figure 16:
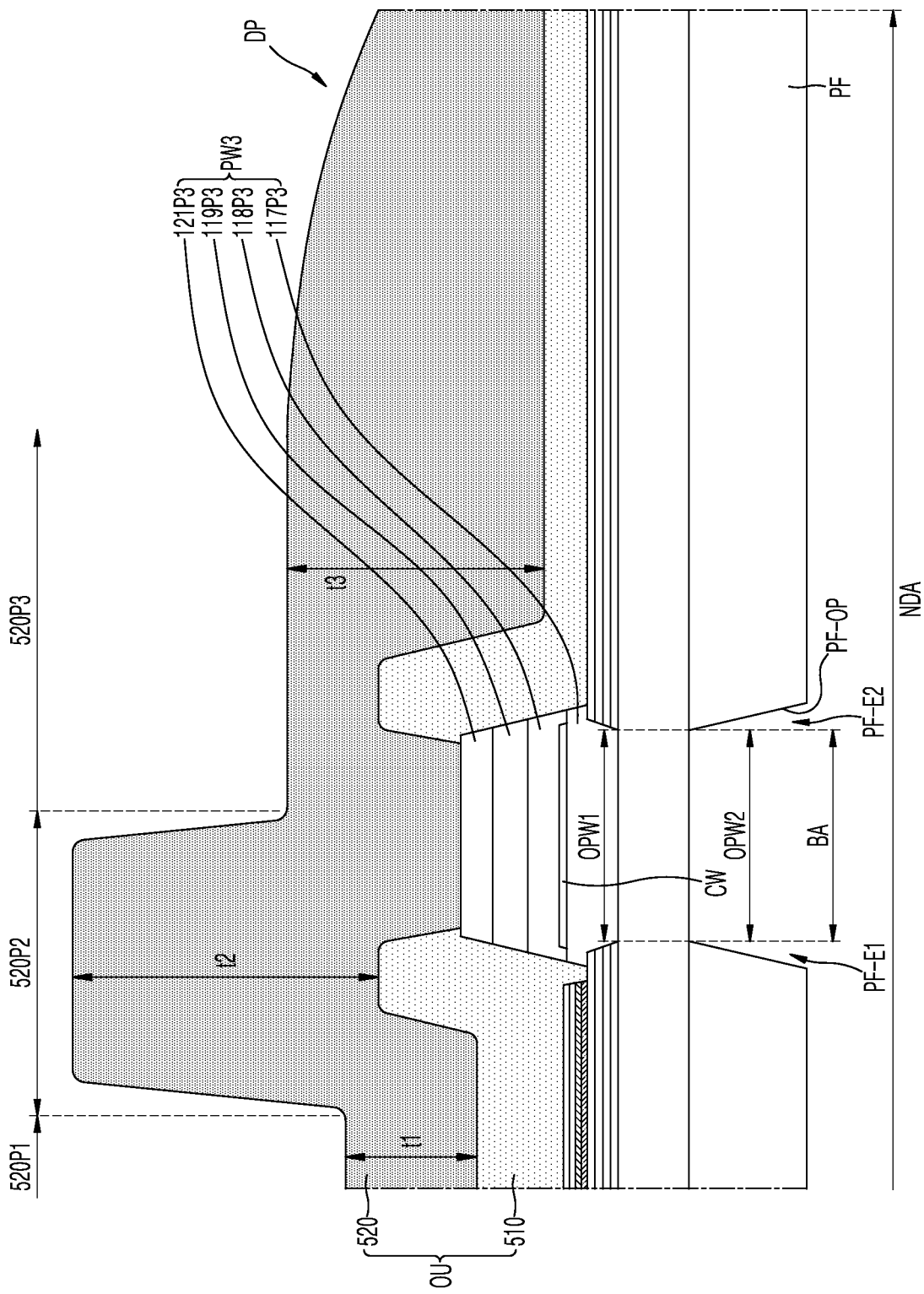

FIGS. 15 and 16 are cross-sectional views schematically showing a portion of the display device 1 according to an embodiment.

Referring to FIGS. 15 and 16, the display panel DP and a portion of the protection film PF arranged at the lower portion of the display panel DP are illustrated. In FIG. 15, a structure of the display panel DP includes the substrate 100, the inorganic insulating layer IIL disposed on the substrate 100, a first organic insulating layer OL1 disposed on the inorganic insulating layer IIL, a second organic insulating layer OL2, a wiring layer WL arranged between the first organic insulating layer OL1 and the second organic insulating layer OL2, and the second layer 520 disposed on the second organic insulating layer OL2. However, this is only for convenience of description, and some layers are omitted or simplified. The inorganic insulating layer IIL may be the organic insulating layer IIL described with reference to FIG. 11, and the first organic insulating layer OL1 and second organic insulating layer OL2 may be at least one of the first planarization insulating layer 117, second planarization insulating layer 118, and pixel-defining layer 119 described with reference to FIG. 11, may be a layer or structure including a same material as those, or may be organic material layers provided separately. The wiring layer WL may be the fanout wire FW described with reference to FIG. 5.

The protection film PF may be arranged on the bottom surface of the display panel DP. The protection film PF is thicker and less flexible than the display panel DP, and thus the protection film PF may include the opening area PF-OP in an area corresponding to the bending area BA. The protection film PF is not arranged in the bending area BA, and thus the display panel DP may be easily bent.

Meanwhile, referring to FIG. 16, the bending area BA may correspond to a width OPW1 of the opening portion IIL-OP of the inorganic insulating layer IIL, and a width OPW2 of the opening area PF-OP of the protection film PF may be the same as the bending area BA, i.e., the width OPW1 of the opening portion IIL-OP of the inorganic insulating layer IIL. However, an embodiment is not limited thereto, and the width OPW2 of the opening area PF-OP of the protection film PF may be greater than the width OPW1 of the opening portion IIL-OP of the inorganic insulating layer IIL.

The display device 1 illustrated in FIG. 16 is in a state before being bent, and the second layer 520 located at the upper layer portion of the display panel DP may be provided to have different thicknesses at a boundary portion of the bending area BA. Here, the thickness may denote an average thickness of a first portion 520P1, a second portion 520P2, and a third portion 520P3.

In detail, the second layer 520 may include the first portion 520P1 having a first thickness t1 in an area corresponding to the display area DA, the second portion 520P2 having a second thickness t2 in an area corresponding to a first boundary portion PE-E1 of the protection film PF adjacent to the display area DA, and the third portion 520P3 having a third thickness t3 in an area corresponding to a second boundary portion PE-E2 located opposite to the first boundary portion PE-E1. According to an embodiment, the second thickness t2 of the second portion 520P2 may be greater than the first thickness t1 of the first portion 520P1. Also, according to an embodiment, the second thickness t2 of the second portion 520P2 may be greater than the third thickness t3 of the third portion 520P3. Meanwhile, the first thickness t1 of the first portion 520P1 and the third thickness t3 of the third portion 520P3 may be the same as or different from each other.

In other words, the thickness of the second layer 520 may be relatively great in the second portion 520P2 corresponding to the first boundary portion PE-E1 of the protection film PF adjacent to the display area DA compared to the first portion 520P1 and third portion 520P3. This may be because relatively great stress is concentrated on the first boundary portion PE-E1 of the protection film PF adjacent to the display area DA while the display panel DP is bent. Accordingly, by forming the thickness of the second portion 520P2 of the second layer 520 corresponding to the first boundary portion PE-E1 of the protection film PF adjacent to the display area DA to be greater than remaining portions, a neutral plane of a corresponding portion may be further raised and stress concentration may be relieved.

For example, the first thickness t1 of the first portion 520P1 may be controlled to be about 10 μm to about 25 μm according to an effect of optical properties. Also, the second thickness t2 of the second portion 520P2 may be controlled to be about 20 μm to about 40 μm so as to distribute stress concentrated during bending alignment of the display panel DP. The third thickness t3 of the third portion 520P3 may be controlled to be about 10 μm to about 30 μm so as to reduce a non-display area (so-called dead space).

The thicknesses of the first portion 520P1, second portion 520P2, and third portion 520P3 of the second layer 520 are differently formed by adjusting density of ink (edge compensation (EC) control) ejected during an inkjet process.

Figure 17:
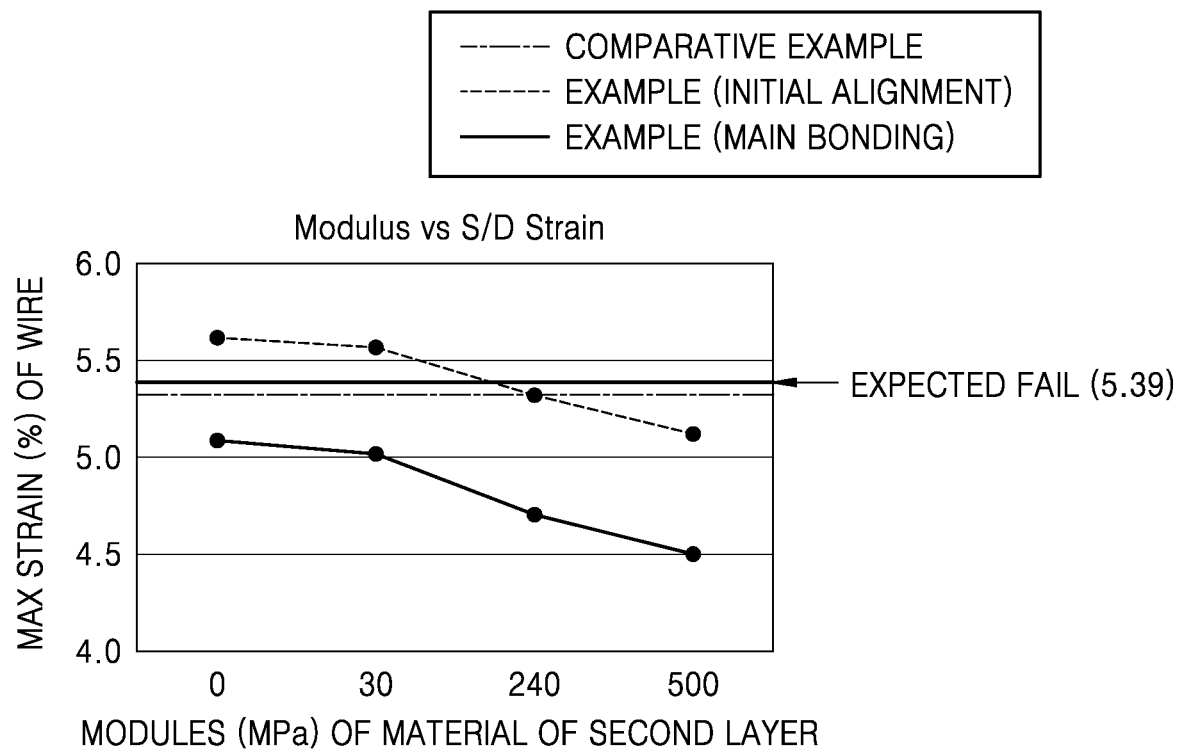
FIG. 17 is a graph showing a relationship between a strain applied to a wire on a bending area during bending and a modulus of a second layer.

Referring to FIG. 17, even when the second layer 520 extends up to the bending area BA in the display device 1 according to an embodiment as described above, a strain of wires arranged in the bending area BA when the bending area BA is bent satisfies a sufficient effect range.

In detail, as described with reference to FIG. 9B, in the comparative example in which the material layer 1000 is applied to the bending area BA, initial alignment in which bending of the bending area BA starts during a process of bending the bending area BA and main bonding in which the bending is finally ended both satisfy below 5.39% that is a defect reference strain. In comparison, in an embodiment in which the second layer 520 is applied to the bending area BA, strains of wires arranged in the bending area BA are about 5% or less in case of main bonding in which bending is finally ended, and thus are less than 5.39 that is the defect reference strain. In particular, in initial alignment in which stress is concentrated on the wires, a wire strain equal to or less than the comparative example is exhibited when a modulus of a material forming the second layer 520 is 240 MPa or greater. Accordingly, even in an embodiment in which the material layer 1000 is removed and the second layer 520 is provided, stress concentrated on the wires arranged in the bending area BA may be sufficiently distributed.

Meanwhile, as described with reference to FIGS. 15 and 16, by differentiating the thickness of the second layer 520, the strain of wire concentrated on the bending area BA during bending described in FIG. 17 may be further relieved.

In detail, while bending the bending area BA, relatively great stress is concentrated on the first boundary portion PE-E1 of the protection film PF adjacent to the display area DA, and thus the thickness of the second portion 520P2 of the second layer 520 corresponding to the first boundary portion PE-E1 of the protection film PF adjacent to the display area DA may be formed to be greater than remaining portions, thereby further effectively relieving the strain of wire instantaneously concentrated on the second portion 520P2.

Figure 18:
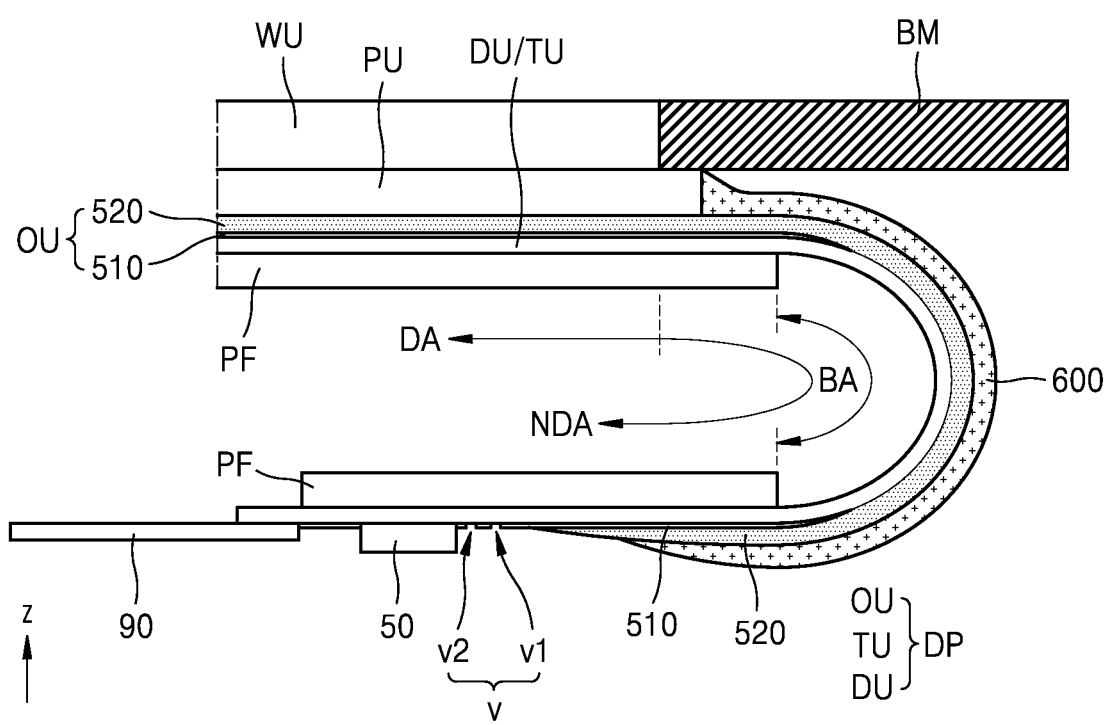
FIG. 18 is a cross-sectional view of a portion of a display device including a bent display panel, according to an embodiment.
Figure 19:
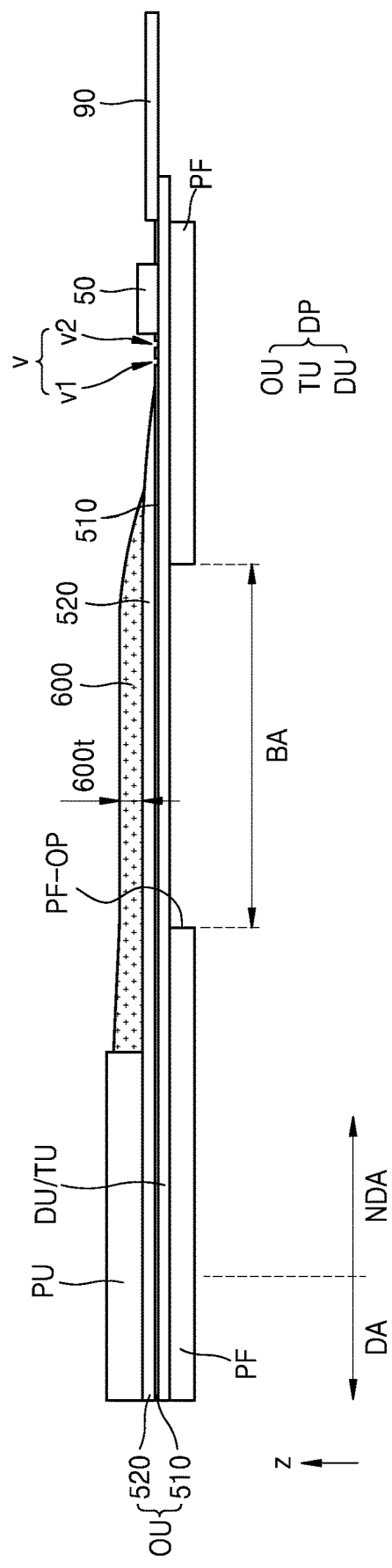
FIG. 19 is a cross-sectional view schematically showing a display panel in an unfolded state, according to an embodiment.
Figure 20:
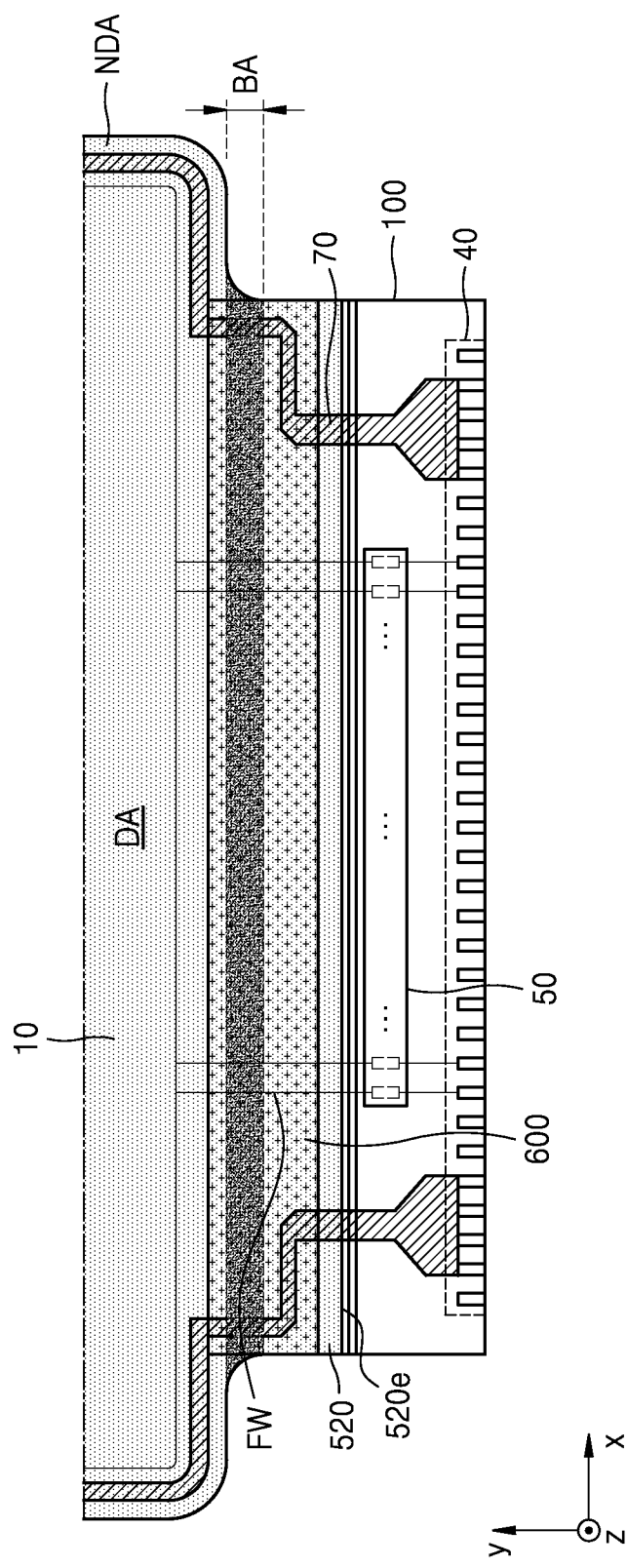
FIG. 20 is a plan view schematically showing a display panel in an unfolded state, according to an embodiment.

FIGS. 18 through 20 illustrate the display device 1 according to an embodiment. FIG. 18 is a cross-sectional view of a portion of the display device 1 including the bent display panel DP. FIG. 19 is a cross-sectional view schematically showing the display panel DP in an unfolded state. FIG. 20 is a plan view schematically showing the display panel DP in an unfolded state. In FIGS. 18 through 20, like reference numerals as in FIGS. 6 through 9A denote like elements, and thus redundant descriptions thereof are omitted.

Referring to FIGS. 18 through 20, a bending protection layer 600 may be further arranged in the bending area BA of the display panel DP. The bending protection layer 600 may be disposed on the second layer 520 of the optical functional layer OI corresponding to the bending area BA.

In the display device 1 according to an embodiment, stress of the wires arranged in the bending area BA may be reduced by adjusting the location of the neural plane by the second layer 520 arranged in the bending area BA. Also, an edge of the second layer 520 is arranged between the bending area BA and the driving circuit unit 50, and thus a spot caused by the edge of the second layer 520 may not be viewed in the display area DA.

The bending protection layer 600 may be disposed on such a second layer 520 to protect the second layer 520. Alternatively, the bending protection layer 600 may adjust the location of the neural plane, together with the second layer 520. In the present embodiment, the second layer 520 mainly adjusts the location of the neural plane, and a thickness of the bending protection layer 600 may be less than that of the existing material layer 1000 of FIG. 9B.

The bending protection layer 600 may contact an end of the polarizing layer PU. In FIG. 18, the bending protection layer 600 is arranged only at a side surface of the polarizing layer PU, but the disclosure is not limited thereto. For example, the bending protection layer 600 may cover a portion of a top surface of an edge of the polarizing layer PU.

The bending protection layer 600 may be arranged to entirely cover the bending area BA from the end of the polarizing layer PU. The area of the bending protection layer 600 on a plane may be greater than the area of the bending area BA. Unlike the second layer 520, the bending protection layer 600 may be arranged only in the peripheral area NDA.

The edge of the bending protection layer 600 may be provided between the bending area BA and the driving circuit unit 50. The bending protection layer 600 may be disposed on the top surface of the second layer 520 to expose the end 520e of the second layer 520. However, the disclosure is not limited thereto. For example, the bending protection layer 600 may cover the end 520e of the second layer 520.

The thickness of the bending protection layer 600 may be greatest at a portion contacting the polarizing layer PU and may decrease towards the edge of the display panel DP. The bending protection layer 600 may be arranged substantially in a uniform thickness in response to the bending area BA. A thickness 600t of the bending protection layer 600 in the bending area BA may be about 40 μm to about 100 μm.

The bending protection layer 600 may include acryl-based resin or urethane-based resin. According to some embodiments, the bending protection layer 600 may include light-shielding material. When the bending protection layer 600 includes the light-shielding material, optical density of the bending protection layer 600 may be in a range of 1 to 5. The optical density is a value indicating a degree a material absorbs light, and when the optical density of the bending protection layer 600 is between 1 and 5, the bending protection layer 600 may blind lower structures and sufficiently absorb external light. In this case, the bending protection layer 600 may operate as a black matrix of the display device 1, together with the light-shielding portion BM.

According to an embodiment described above, a display device in which a width of a non-display area is reduced and a thickness is reduced in overall may be realized. Obviously, the scope of the disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a display area and a peripheral area that includes a bending area disposed adjacent to the display area;
   a display element arranged in the display area;
   a driving circuit arranged in the peripheral area;
   a barrier rib layer arranged in the bending area;
   an input detection layer disposed on the display element; and
   an optical functional layer including a first layer that is disposed on the input detection layer and includes a first opening in an area corresponding to the display element, and a second layer that is disposed on the first layer and having a refractive index different from the first layer, wherein the first layer includes at least one valley located between the bending area and the driving circuit.

2. The display device of claim 1, wherein the first layer extends from the display area to the peripheral area and includes a second opening in an area corresponding to the bending area, and the second layer directly contacts a top surface of the barrier rib layer through the second opening.

3. The display device of claim 2, wherein the at least one valley includes a first valley and a second valley which are spaced apart from each other.

4. The display device of claim 3, wherein the bending area bends about a bending axis in a first direction, and the at least one valley extends in the first direction.

5. The display device of claim 1, wherein the second layer extends to the peripheral area and an end of the second layer is located between the at least one valley and the bending area.

6. The display device of claim 1, wherein the second layer extends to the peripheral area and an end of the second layer is located in the at least one valley.

7. The display device of claim 1, wherein the second layer has a modulus of 0.2 GPa to 1.5 GPa.

8. The display device of claim 1, wherein the second layer has elongation of 10% or greater.

9. The display device of claim 1, wherein the second layer has light transmittance of 90% or greater.

10. The display device of claim 1, wherein an air layer is disposed on the second layer corresponding to the bending area.

11. The display device of claim 1, wherein a light-shielding portion is further arranged on an upper portion of the second layer in an area corresponding to the peripheral area, and a space of the bending area between the second layer and the light-shielding portion is an empty space.

12. The display device of claim 1, wherein an interval between the at least one valley and the driving circuit is 100 μm to 400 μm.

13. The display device of claim 1, wherein a top surface of the second layer is flat on the display area and bending area.

14. The display device of claim 13, wherein a thickness of the second layer gradually decreases to an end of the second layer.

15. The display device of claim 1, further comprising a protection film disposed on one surface of the substrate, wherein the protection film includes an opening area in an area corresponding to the bending area.

16. The display device of claim 15, wherein the second layer includes a first portion having a first thickness in an area corresponding to the display area, a second portion having a second thickness in an area corresponding to a first boundary portion of the protection film adjacent to the display area, and a third portion having a third thickness in an area corresponding to a second boundary portion of the protection film which is opposite to the first boundary portion, and wherein the second thickness of the second portion is greater than the first thickness of the first portion.

17. The display device of claim 16, wherein the second thickness of the second portion is greater than the third thickness of the third portion.

18. The display device of claim 16, wherein the third thickness of the third portion is greater than the first thickness of the first portion and less than the second thickness of the second portion.

19. The display device of claim 16, wherein the first thickness of the first portion is 10 μm to 25 μm, and the second thickness of the second portion is 20 μm to 40 μm.

20. The display device of claim 1, further comprising:

a polarizing layer disposed on the second layer in an area corresponding to the display area; and a window layer disposed on the polarizing layer.

21. The display device of claim 1, further comprising an inorganic insulating layer disposed on the substrate and including an opening portion in an area corresponding to the bending area, wherein the barrier rib layer is arranged to cover the opening portion.

22. The display device of claim 1, wherein the second layer includes about 5% to about 40% of difunction acrylate monomers.

23. The display device of claim 1, wherein a bending protection layer is further disposed on the second layer corresponding to the bending area.

* * * * *